US012635321B2

(12) United States Patent
Kitajima et al.

(10) Patent No.: US 12,635,321 B2
(45) Date of Patent: May 19, 2026

(54) LIGHT EMITTING DEVICE AND LIGHT EMITTING MODULE

(71) Applicant: NICHIA CORPORATION, Anan (JP)

(72) Inventors: Tadayuki Kitajima, Itano-gun (JP);
Kazuma Kozuru, Anan (JP)

(73) Assignee: NICHIA CORPORATION, Anan (JP)

( * ) Notice: Subject to any disclaimer, the term of this
patent is extended or adjusted under 35
U.S.C. 154(b) by 372 days.

(21) Appl. No.: 18/457,787

(22) Filed: Aug. 29, 2023

(65) Prior Publication Data

US 2024/0088336 A1    Mar. 14, 2024

(30) Foreign Application Priority Data

Sep. 8, 2022    (JP) ................................. 2022-142877

(51) Int. Cl.
| | |
|---|---|
| *H10H 20/856* | (2025.01) |
| *H01S 5/02208* | (2021.01) |
| *H01S 5/02255* | (2021.01) |
| *H01S 5/02257* | (2021.01) |
| *H01S 5/02315* | (2021.01) |
| *H01S 5/02325* | (2021.01) |
| *H01S 5/02345* | (2021.01) |
| *H01S 5/40* | (2006.01) |
| *H10H 20/85* | (2025.01) |
| *H10H 20/857* | (2025.01) |
| *H10H 20/858* | (2025.01) |
| *H10H 29/14* | (2025.01) |

(52) U.S. Cl.
CPC ........ *H10H 20/856* (2025.01); *H10H 20/857*
(2025.01); *H10H 29/142* (2025.01); *H10H*
*20/8506* (2025.01); *H10H 20/8582* (2025.01)

(58) Field of Classification Search
CPC .............. H01S 5/4031; H01S 5/02355; H10H
20/8506; H10H 20/856
See application file for complete search history.

(56) References Cited

U.S. PATENT DOCUMENTS

| | | | |
|---|---|---|---|
| 2017/0033528 A1* | 2/2017 | Tanisaka ............. H01S 5/02326 |
| 2017/0063034 A1 | 3/2017 | Tanisaka | |
| 2021/0359492 A1 | 11/2021 | Kitagawa et al. | |

FOREIGN PATENT DOCUMENTS

| | | |
|---|---|---|
| JP | 2015-228401 A | 12/2015 |
| JP | 2017-032625 A | 2/2017 |
| JP | 2017-045795 A | 3/2017 |
| JP | 2018-011080 A | 1/2018 |
| JP | 2018-107469 A | 7/2018 |

(Continued)

*Primary Examiner* — Antonio B Crite
(74) *Attorney, Agent, or Firm* — Foley & Lardner LLP

(57) ABSTRACT

A light emitting device includes: an insulating base; a first
upper metal part located on an upper surface of the base; a
first light emitting element that is disposed on the upper
surface of the base with the first upper metal part being
interposed between the first light emitting element and the
base, and is configured to emit light laterally from a first
emission end surface of the first light emitting element; a
first reflective member that is disposed on the upper surface
of the base without the first upper metal part being inter-
posed between the first reflective member and the base, faces
the first light emitting element, and has a first reflective
surface configured to reflect the light upward; and one or
more lower metal parts located on the lower surface of the
base.

19 Claims, 17 Drawing Sheets

200

(56)         References Cited

FOREIGN PATENT DOCUMENTS

| | | | |
|---|---|---|---|
| JP | 2021-125657 | A | 8/2021 |
| WO | WO-2020/080539 | A1 | 4/2020 |
| WO | WO-2022/181559 | A1 | 9/2022 |
| WO | WO-2022/202377 | A1 | 9/2022 |

* cited by examiner

LIGHT EMITTING DEVICE AND LIGHT EMITTING MODULE

CROSS-REFERENCE TO RELATED APPLICATIONS

This application is based on and claims priority to Japanese Patent Application No. 2022-142877, filed on Sep. 8, 2022, the entire contents of which are incorporated herein by reference.

BACKGROUND

The disclosure herein relates to a light emitting device and a light emitting module.

Japanese Patent Publication No. 2021-125657 (Patent Document 1) describes a semiconductor laser device in which a heat dissipation substrate, a conductive layer, a light reflecting layer, and a semiconductor laser chip are disposed in this order, and a reflecting mirror is provided in the light emission direction of the semiconductor laser chip. The semiconductor laser device has a configuration in which the light reflecting layer protrudes further toward the reflecting mirror than the semiconductor laser chip, such that a portion of light emitted from the semiconductor laser chip is reflected by the light reflecting layer and is guided to the reflecting mirror.

In the semiconductor laser device described in Patent Document 1, the light reflecting layer protrudes toward the reflecting mirror, thereby increasing a space between the semiconductor laser chip and the reflecting mirror. As a result, the size of the semiconductor laser device may be increased. There is a need to reduce the size of a light emitting device.

SUMMARY

According to a first aspect of the present disclosure, a light emitting device includes a base including a material having an insulating property; a first upper metal part provided on an upper surface of the base; a first light emitting element that is disposed on the upper surface of the base with the first upper metal part being interposed between the first light emitting element and the base, and is configured to emit light laterally from a first emission end surface; a first reflective member that is disposed on the upper surface of the base without the first upper metal part being interposed between the first reflective member and the base, is disposed to face the first light emitting element, and has a first reflective surface configured to reflect the light upward; and one or more lower metal parts provided on a lower surface of the base. A thickness of the first upper metal part is 150 µm or more and 250 µm or less. A distance between the first emission end surface and a first point on the first reflective surface closest to the first emission end surface in a first direction is less than or equal to the thickness of the first upper metal part in a second direction. The first direction is perpendicular to the first emission end surface, and the second direction is perpendicular to the upper surface of the base. A total thickness of the first upper metal part and each of the one or more lower metal parts is greater than a thickness of the base.

According to a second aspect of the present disclosure, a light emitting module includes a plurality of light emitting devices according to the first aspect of the present disclosure, and a wiring substrate having a plurality of wiring patterns arranged in a third direction. The plurality of light emitting devices are arranged in the third direction.

According to the embodiments of the present disclosure, the light emitting device and/or the light emitting module can be made small.

BRIEF DESCRIPTION OF THE DRAWINGS

Other objects and further features of the present invention will be apparent from the following detailed description when read in conjunction with the accompanying drawings, in which:

FIG. 17 is a top view of the light emitting module illustrated in FIG. 16, from which covers of the light emitting devices are removed;

FIG. 18 is a top view of a wiring substrate constituting part of the light emitting module illustrated in FIG. 16;

FIG. 21 is a top view of a wiring substrate constituting part of the light emitting module illustrated in FIG. 19.

DETAILED DESCRIPTION

Figure 1:
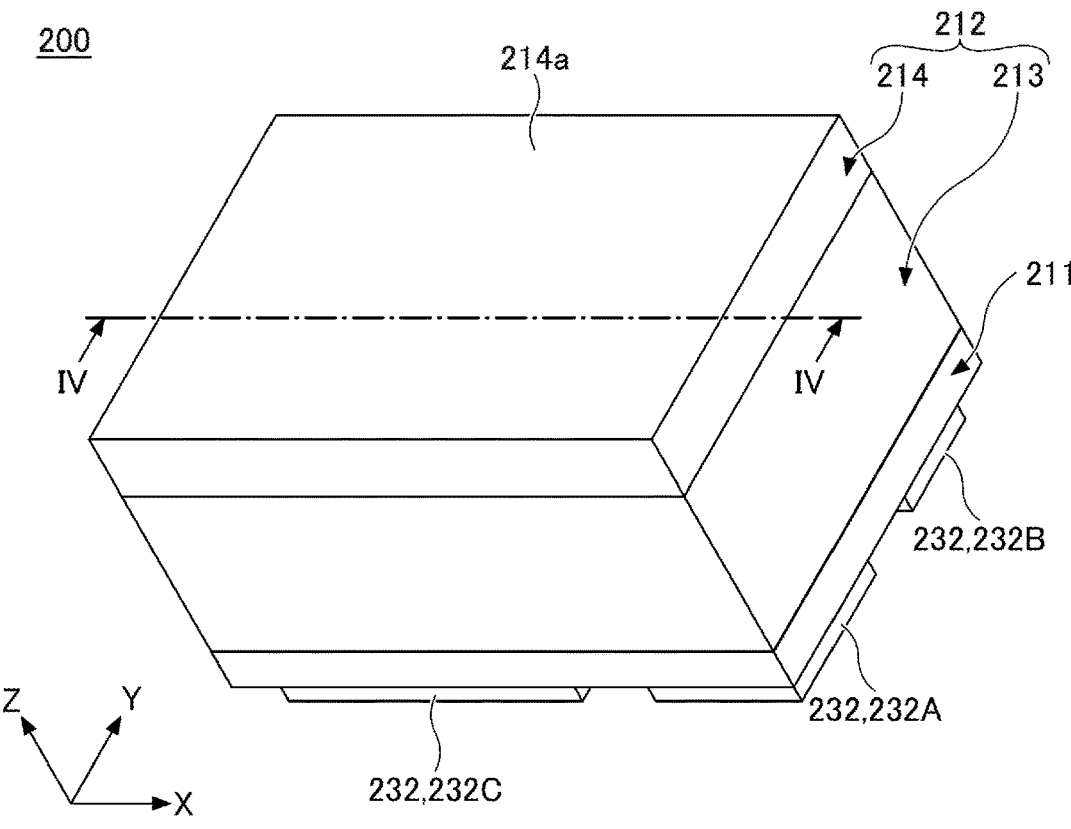
FIG. 1 is a perspective view of a light emitting device according to a first embodiment.

In the following description, embodiments of the present invention will be described with reference to the accompanying drawings. In the following description, terms indicating specific directions and positions (for example, "upper," "lower," and other terms including or related to these terms) are used as necessary. These terms are used to facilitate understanding of the present invention with reference to the drawings, and the technical scope of the present invention is not unduly limited by the meaning of these terms. For example, the term "upper surface" does not necessarily mean that the "upper surface" must face upward at all times. The same reference numerals appearing in a plurality of drawings refer to the same, equivalent, or similar portions or members.

In the present disclosure, the term "polygonal shape" such as a triangular shape and a quadrangular shape encompasses polygonal shapes in which corners of the polygonal shapes are processed to be rounded, chamfered, beveled, coved, and the like. Furthermore, the term "polygonal shape" not only encompasses polygonal shapes in which corners (ends of sides) are processed, but also encompasses polygonal shapes in which intermediate portions of the sides are processed. In other words, shapes that are based on polygonal shapes and partially processed are construed as "polygonal shapes" as described in the present disclosure.

The same applies not only to polygonal shapes, but also to terms indicating specific shapes such as trapezoidal shapes, circular shapes, and projections and recesses. The same also applies when referring to sides forming such a shape. In other words, even if a corner or an intermediate portion of a side is processed, the "side" is construed as including the processed portion. In order to distinguish a "polygonal shape" or a "side" that is not partially processed from a processed shape, such a shape may be expressed with the word "strict" added thereto, for example, a "strict quadrangular shape."

Further, the following embodiments exemplify a light emitting device and the like to embody the technical ideas of the present invention, and the present invention is not limited to the following description. In addition, unless otherwise specified, the dimensions, materials, shapes, relative arrangements, and the like of components described below are not intended to limit the scope of the present invention thereto, but are described as examples. The contents described in one embodiment can be applied to other embodiments and modifications. The sizes, positional relationships, and the like of members illustrated in the drawings may be exaggerated for clearer illustration. Furthermore, in order to avoid excessive complication of the drawings, a schematic view in which some elements are not illustrated may be used, or an end view illustrating only a cut surface may be used as a cross-sectional view.

First Embodiment

A light emitting device according to a first embodiment includes a base, an upper metal part, a light emitting element, and a reflective member. An example of the structure of a light emitting device 200 according to the first embodiment will be described with reference to FIG. 1 through FIG. 9.

Figure 2:
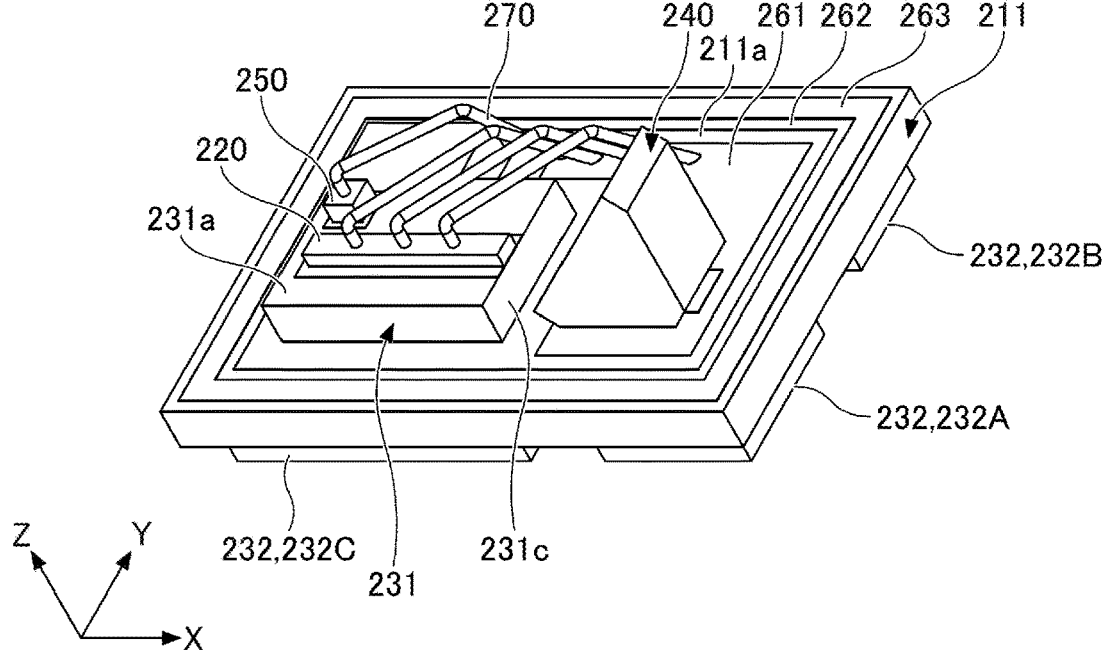
FIG. 2 is a perspective view of the light emitting device illustrated in FIG. 1, from which a cover is removed.
Figure 3:
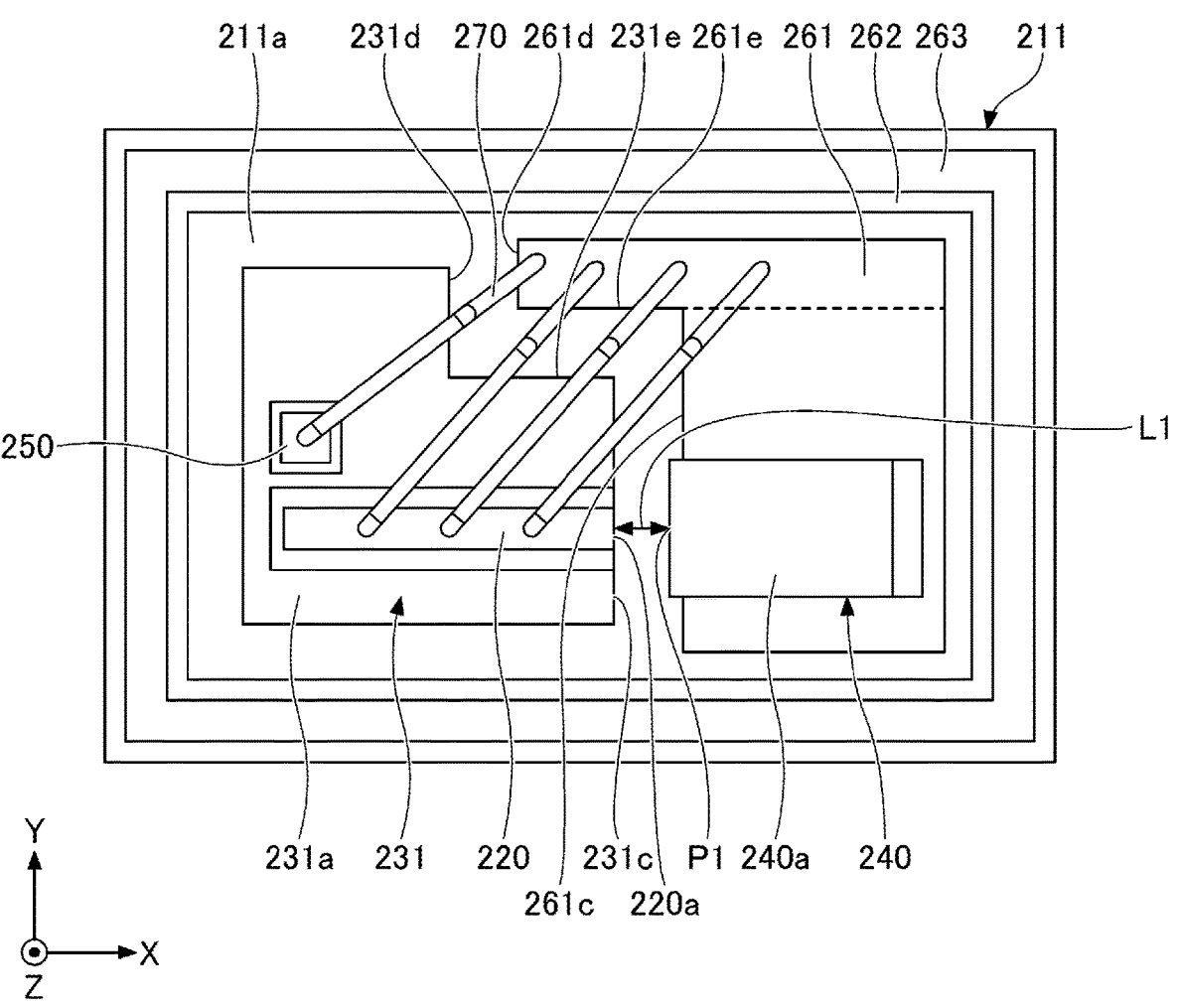
FIG. 3 is a top view of the light emitting device illustrated in FIG. 1, from which the cover is removed.
Figure 4:
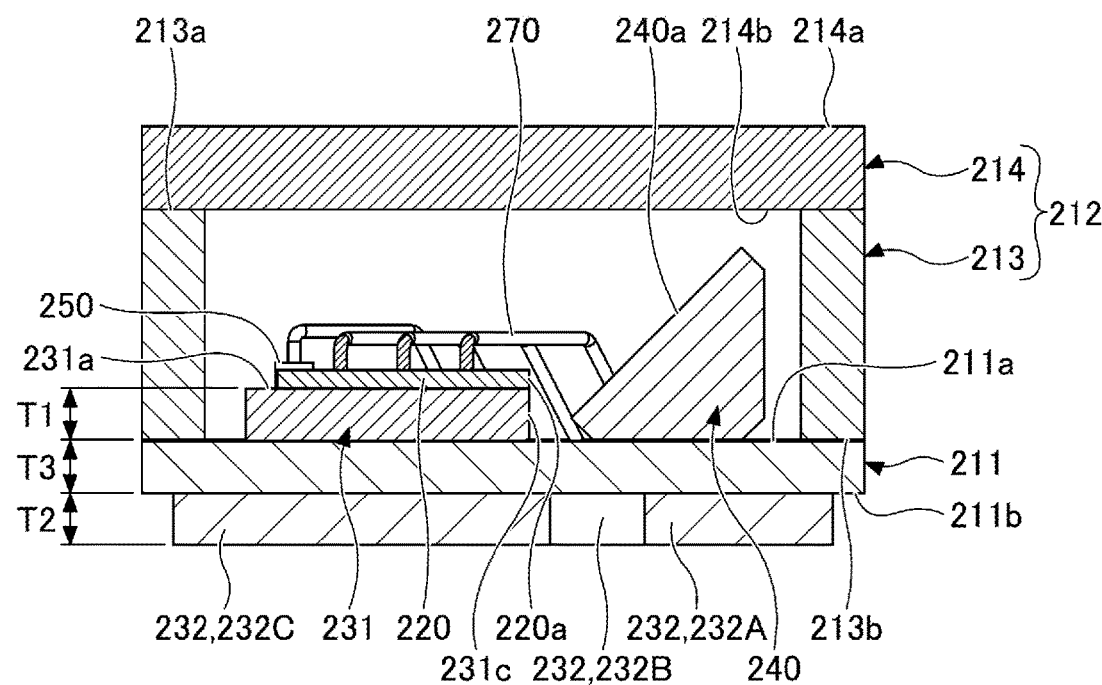
FIG. 4 is a cross-sectional view of the light emitting device taken through a cross-sectional line IV-IV of FIG. 1.
Figure 4:
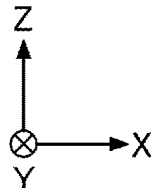
Figure 5:
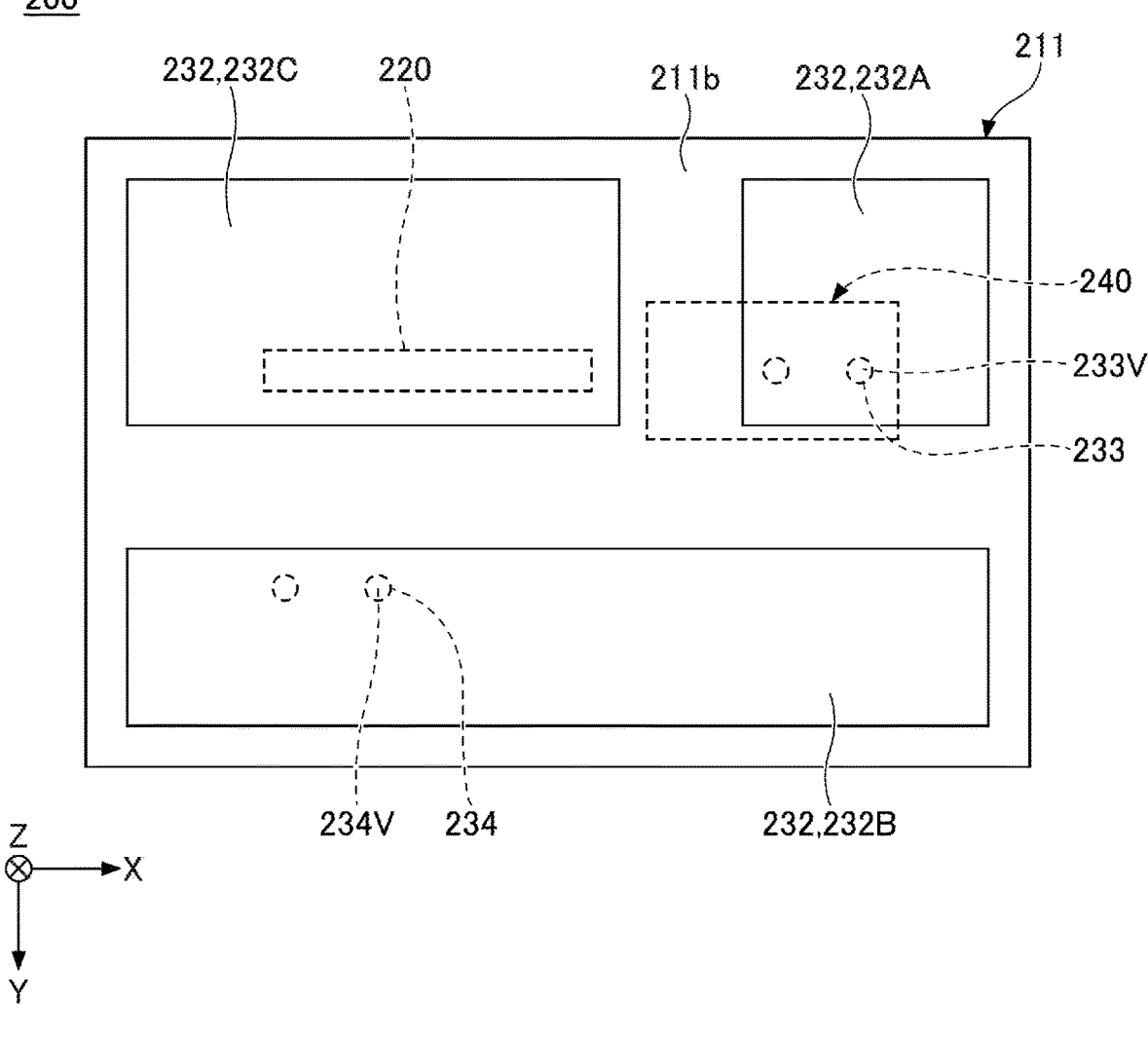
FIG. 5 is a bottom view of the light emitting device according to the first embodiment.
Figure 6:
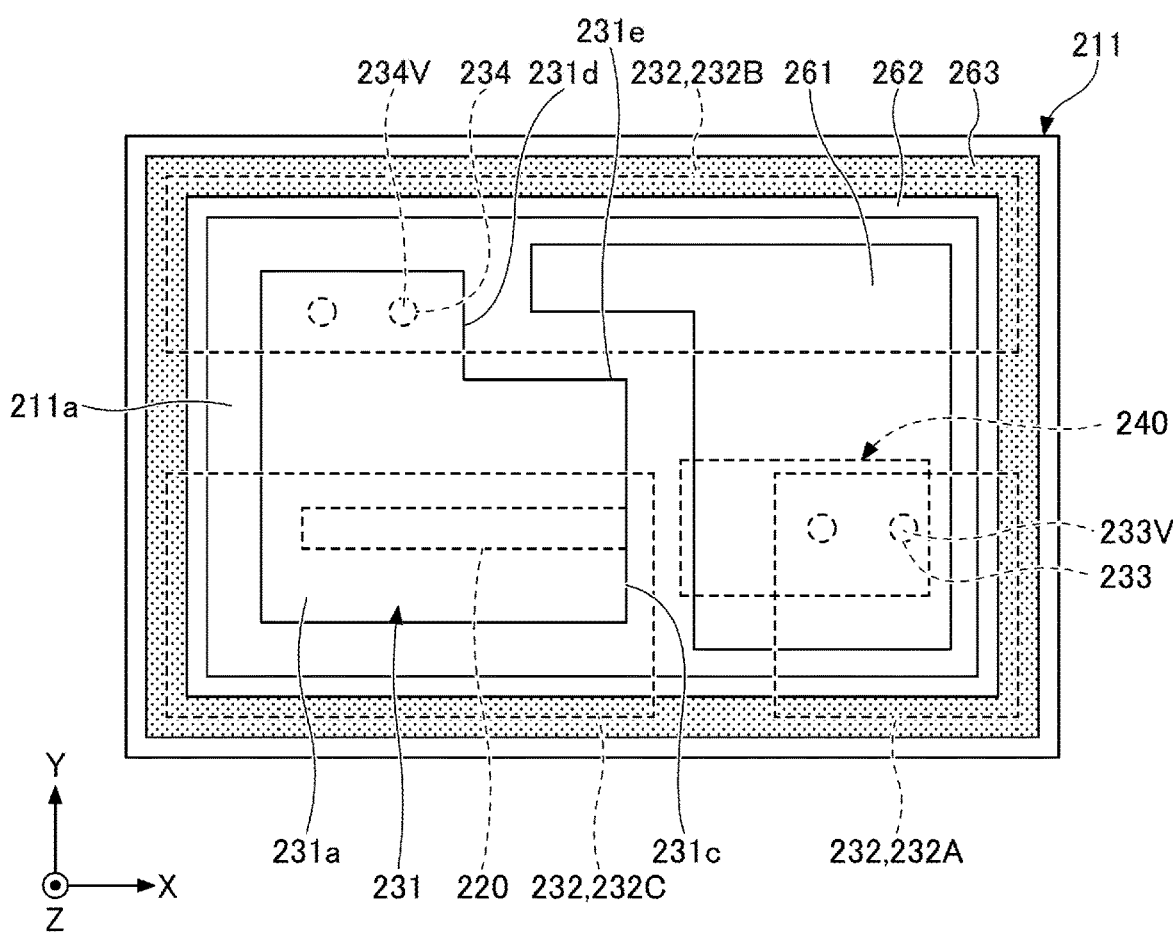
FIG. 6 is a top view illustrating metal films provided on a base and via wirings provided in the base.
Figure 7:
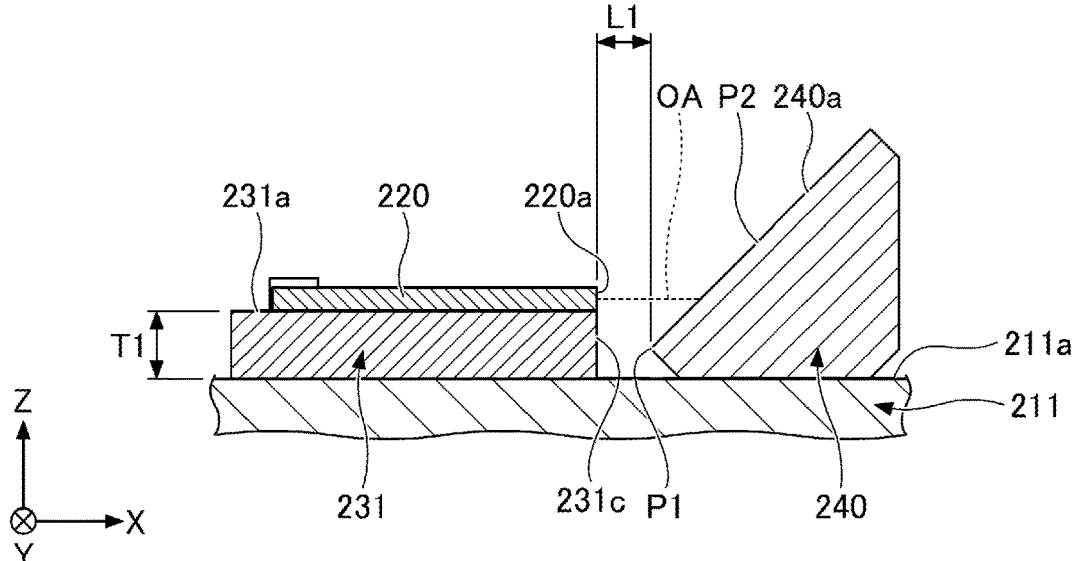
FIG. 7 is an enlarged cross-sectional view (part 1) of a light emitting element, a reflective member, and their surroundings in the light emitting device illustrated in FIG. 4.
Figure 8:
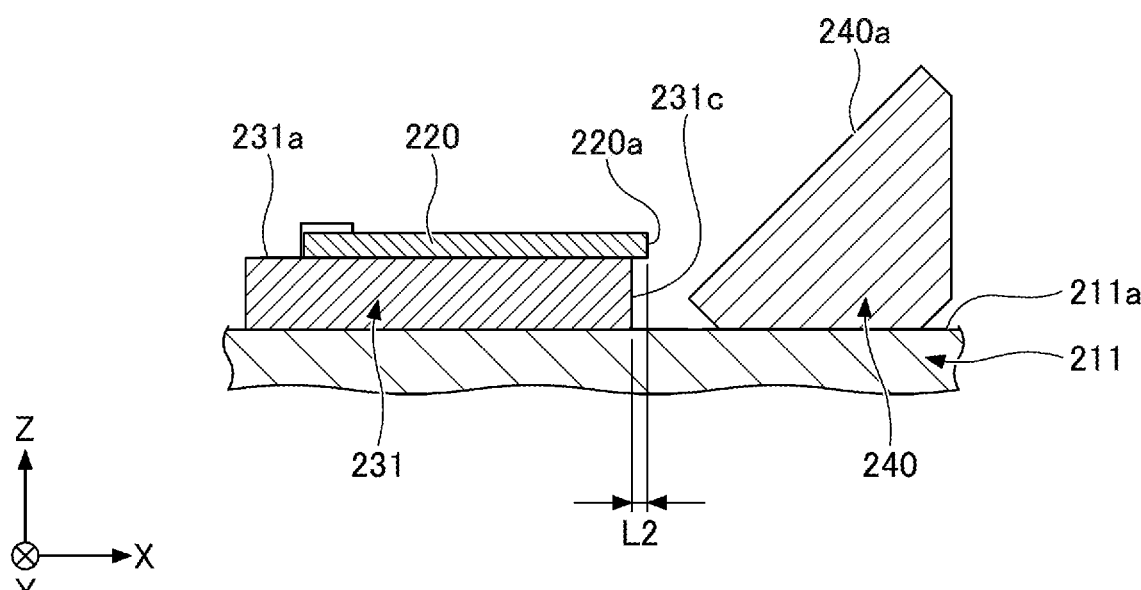
FIG. 8 is an enlarged cross-sectional view (part 2) of the light emitting element, the reflective member, and their surroundings in the light emitting device illustrated in FIG. 4.
Figure 9:
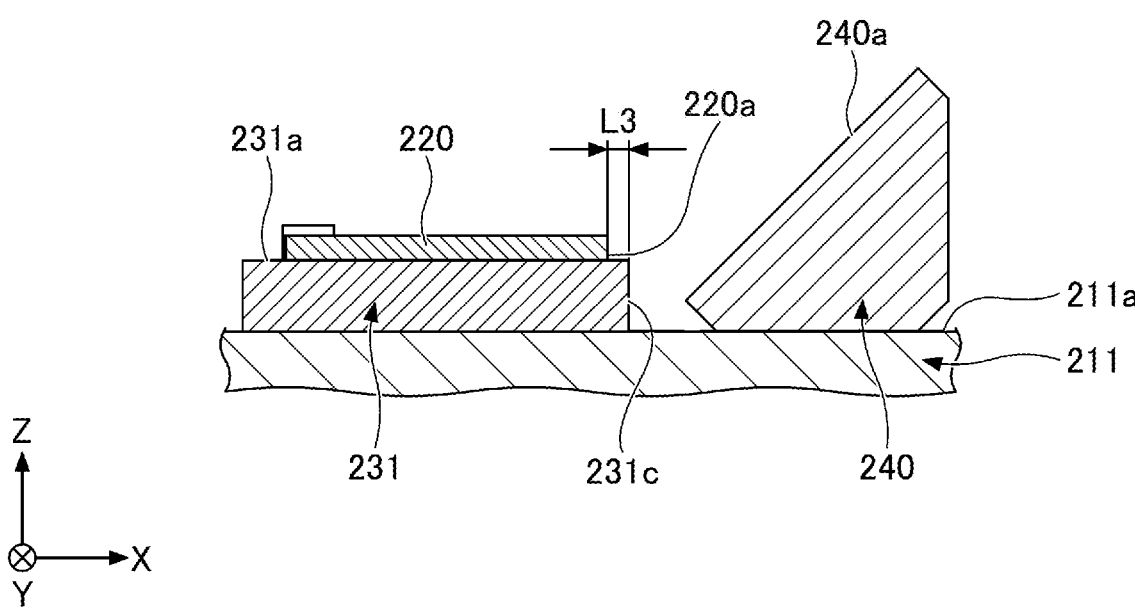
FIG. 9 is an enlarged cross-sectional view (part 3) of the light emitting element, the reflective member, and their surroundings in the light emitting device illustrated in FIG. 4.

FIG. 1 is a perspective view of the light emitting device 200 according to the first embodiment. FIG. 2 is a perspective view of the light emitting device 200 illustrated in FIG. 1, from which a cover 212 is removed. FIG. 3 is a top view of the light emitting device 200 illustrated in FIG. 1, from which the cover 212 is removed. FIG. 4 is a cross-sectional view of the light emitting device 200 taken through a cross-sectional line IV-IV of FIG. 1. FIG. 5 is a bottom view of the light emitting device 200 according to the first embodiment. FIG. 6 is a top view illustrating metal films provided on a base 211 and via wirings provided in the base 211. FIG. 7 is an enlarged cross-sectional view (part 1) of a light emitting element 220, a reflective member 240, and their surroundings in the light emitting device 200 illustrated in FIG. 4. FIG. 8 is an enlarged cross-sectional view (part 2) of the light emitting element 220, the reflective member 240, and their surroundings in the light emitting device 200 illustrated in FIG. 4. FIG. 9 is an enlarged cross-sectional view (part 3) of the light emitting element 220, the reflective member 240, and their surroundings in the light emitting device 200 illustrated in FIG. 4.

The light emitting device 200 according to the present embodiment includes the base 211, the light emitting element 220, an upper metal part 231, lower metal parts 232, and the reflective member 240. In the illustrated example, the light emitting device 200 further includes the cover 212, a protective element 250, and a wiring 270. the light emitting device 200 does not necessarily include all of the above components.

Each of the components of the light emitting device 200 will be described. The upper metal part 231 and the lower metal parts 232 of the light emitting device 200 will be described together with the base 211.

In FIG. 1 through FIG. 9, an X-axis, a Y-axis, and a Z-axis orthogonal to one another are illustrated for reference. Directions parallel to the X-axis, the Y-axis, and the Z-axis are defined as a first direction X, a second direction Y, and a third direction Z, respectively. The first direction X and the second direction Y are parallel to an upper surface 211a of the base 211, and the third direction Z is perpendicular to the upper surface 211a of the base 211.

(Base 211, Upper Metal Part 231, Lower Metal Parts 232)

The base 211 has the upper surface 211a and a lower surface 211b. The upper surface 211a and the lower surface 211b may or may not be parallel to each other. Further, the base 211 has one or more lateral surfaces connected to the upper surface 211a and the lower surface 211b. The one or more lateral surfaces connect the outer edge of the upper surface 211a and the outer edge of the lower surface 211b. The base 211 is, for example, a rectangular parallelepiped or a cube. In this case, each of the upper surface 211a and the lower surface 211b of the base 211 has a rectangular shape, and the base 211 has four lateral surfaces each having a rectangular shape. The term "rectangular shape" may include a square shape unless specifically mentioned to exclude a square shape. The base 211 is not necessarily a rectangular parallelepiped or a cube. For example, the base 211 may have any plate shape in a top view. The shape of the base 211 in a top view is not limited to a plate shape, and the base 211 may have any shape, such as a circular shape, an elliptical shape, or a polygonal shape in a top view.

The base 211 includes a material having, for example, an insulating property. The base 211 may be formed of ceramic as the main material. For example, aluminum nitride, silicon nitride, aluminum oxide, or silicon carbide may be used as the ceramic. The main material forming the base 211 may be an electrically conductive material. For example, examples of the main material of the base 211 include metal such as aluminum, gold, silver, copper, tungsten, iron, nickel, cobalt, or an alloy thereof, diamond, a copper-diamond composite material, and the like.

The upper metal part 231 is provided on the upper surface 211a of the base 211. The material forming the upper metal part 231 may be, for example, copper. Other examples of the material forming the upper metal part 231 include copper-tungsten. The thickness T1 of the upper metal part 231 is 150 μm or more and 250 μm or less.

The upper metal part 231 is provided close to one short side of two short sides facing each other in the long side direction of the upper surface 211a in a top view. More specifically, of the two short sides of the upper surface 211a, the upper metal part 231 is provided close to the negative side in the first direction X. In the illustrated example, the upper metal part 231 has a projecting shape in a top view. More specifically, the upper metal part 231 has a projecting portion that projects toward the center of the upper surface 211a in the long side direction of the upper surface 211a (in the first direction) in a top view. For the sake of description, a portion that is recessed toward the negative side in the first direction X relative to the projecting portion in a top view is referred to as a recessed portion. In the illustrated example, a lateral surface 231c of the projecting portion is located closer to the center of the upper surface 211a than the lateral surface 231d of the recessed portion is. the upper metal part 231 may have a rectangular shape in a top view.

The projecting portion and the recessed portion will be further described. The upper metal part 231 has a lateral surface 231e connected to the lateral surface 231c and the lateral surface 231d. The projecting portion of the upper metal part 231 is the entire portion including the side surface 231c with respect to a straight line that passes along the lateral surface 231e and is parallel to the lateral surface 231e in a top view. The recessed portion of the upper metal part 231 is the entire portion including the lateral surface 231d with respect to the straight line that passes along the lateral surface 231e and is parallel to the lateral surface 231e in a top view.

The length of the recessed portion is 0.2 times or more and 0.7 times or less the length of the projecting portion in the long side direction of the upper surface 211a (in the first direction X). By setting the length of the recessed portion to 0.7 times or less the length of the projecting portion, the distance between a metal film 261, which will be described later, and a member disposed on the upper surface of the projecting portion at a position close to the recessed portion can be decreased. Further, by setting the length of the recessed portion to 0.2 times or more the length of the projecting portion, the areas of the upper surface 231a and the lower surface of the upper metal part 231 can be increased, and thus, the heat dissipation performance can be improved. Further, the length of the recessed portion is 0.3 times or more and 0.7 times or less the length of the projecting portion in the short side direction of the upper surface 211a (in the second direction Y). By setting the length of the recessed portion to 0.3 times or more the length of the projecting portion, a region where a projecting portion of the metal film 261 is provided can be secured. Further, by setting the length of the recessed portion to 0.7 time or less the length of the projecting portion, the size of the projecting portion can be increased, and thus, the heat dissipation performance can be improved.

One or more lower metal parts 232 may be provided on the lower surface 211b of the base 211. When the lower metal parts 232 are provided on the lower surface 211b of the base 211, the thickness T2 of each of the lower metal parts 232 is preferably 0.8 times or more and 1.2 times or less the thickness T1 of the upper metal part 231. Accordingly, the imbalance of stress between the upper surface 211a side and the lower surface 211b side of the base 211 can be reduced, and thus, warpage of the base 211 can be suppressed. The thickness of the lower metal part 232 is, for example, 120 μm or more and 300 μm or less.

In the illustrated example, the one or more lower metal parts 232 include a first lower metal part 232A, a second lower metal part 232B, and a third lower metal part 232C. As illustrated in FIG. 5, in a bottom view, one corner of the four corners of the first lower metal part 232A is located at or near one corner of the four corners of the lower surface 211b having a rectangular shape. More specifically, the first lower metal part 232A is located on the positive side in the first direction X and the negative side in the second direction Y on the lower surface 211b. In a bottom view, the second lower metal part 232B has a rectangular shape whose side extending in the long side direction of the lower surface 211b is longer than the side extending in the short side direction of the lower surface 211b. More specifically, in a bottom view, the length of the side of the second lower metal part 232B extending in the first direction X is 4.0 times or more the length of the side of the second lower metal part 232B extending in the second direction Y. The second lower metal part 232B is disposed on the positive side in the second direction Y relative to the first lower metal part 232A. In a bottom view, the first lower metal part 232A and the second lower metal part 232B are spaced apart from each other in the short side direction of the lower surface 211b (in the second direction Y). The second lower metal part 232B is longer than the first lower metal part 232A in the long side direction of the lower surface 211b (in the first direction X). In the illustrated example, the length of the second lower metal part 232B is 3.0 times or more the length of the first lower metal part 232A in the first direction X. Further, the second lower metal part 232B is shorter than the first lower metal part 232A in the short side direction of the lower surface 211b (in the second direction Y).

In a bottom view, the third lower metal part 232C is spaced apart from the first lower metal part 232A in the long side direction of the lower surface 211b (in the first direction X), and the third lower metal part 232C is spaced apart from the second lower metal part 232B in the short side direction of the lower surface 211b (in the second direction Y). More specifically, the third lower metal part 232C is disposed on the negative side in the first direction X relative to the first lower metal part 232A, and is disposed on the negative side in the second direction Y relative to the second lower metal part 232B. In a bottom view, the third lower metal part 232C is shorter than the second lower metal part 232B and is longer than the first lower metal part 232A in the long side direction of the lower surface 211b (in the first direction X). Further, the third lower metal part 232C is longer than the second lower metal part 232B in the short side direction of the lower surface 211b.

The plurality of lower metal parts 232 will be further described. In a bottom view, a first virtual line passing through the first lower metal part 232A and parallel to the second direction Y passes through the second lower metal part 232B. In a bottom view, a second virtual line passing through the third lower metal part 232C and parallel to the second direction Y passes through the second lower metal part 232B. In a bottom view, the first virtual line does not pass through the third lower metal part 232C. In a bottom view, the second virtual line does not pass through the first lower metal part 232A.

In a bottom view, a third virtual line passing through the first lower metal part 232A and parallel to the first direction X passes through the third lower metal part 232C. The third virtual line does not pass through the second lower metal part 232B. In a bottom view, a fourth virtual line passing through the second lower metal part 232B and parallel to the first direction X does not pass through the first lower metal part 232A. The fourth virtual line does not pass through the third lower metal part 232C.

The metal film 261 may be further provided on the upper surface 211a of the base 211. In a top view, the metal film 261 is spaced apart from the upper metal part 231. The thickness of the metal film 261 is preferably less than one-third of the thickness T1 of the upper metal part 231 in the third direction Z.

the metal film 261 is provided close to the other short side which is opposite to the one short side close to which the upper metal part 231 is provided. More specifically, of the two short sides of the upper surface 211a opposite to each other in the first direction X, the metal film 261 is provided close to the positive side in the first direction X. In the illustrated example, the metal film 261 has a projecting shape that projects toward the upper metal part 231 (toward the negative side) in the first direction X in a top view. For the sake of description, a portion that is recessed relative to the projecting portion in a top view is referred to as a recessed portion. In the example illustrated in FIG. 3, the boundary between the recessed portion and the projecting portion of the metal film 261 is indicated by a dashed line. The projecting portion of the upper metal part 231 and the recessed portion of the metal film 261 face each other in the first direction X in a top view. The recessed portion of the upper metal part 231 and the projecting portion of the metal film 261 face other in the first direction X in a top view. More specifically, the lateral surface 231c of the upper metal part 231 and a side 261c of the recessed portion of the metal film 261 face each other in a top view. The lateral surface 231d of the upper metal part 231 and a side 261d of the projecting portion of the metal film 261 face each other in a top view.

As illustrated in FIG. 5 and FIG. 6, the base 211 may be provided with a first via wiring 233V. The first via wiring 233V is connected to the metal film 261 and is provided in a through hole 233 penetrating the base 211. In a top view, the first via wiring 233V is connected to the metal film 261 at a position where the recessed portion of the metal film 261 is located. Further, the base 211 may be provided with a second via wiring 234V. The second via wiring 234V is connected to the upper metal part 231 and is provided in a through hole 234 penetrating the base 211. In a top view, the second via wiring 234V is connected to the upper metal part 231 at a position where the recessed portion of the upper metal part 231 is located. The through hole 233 and the through hole 234 penetrate from the upper surface 211a to the lower surface 211b of the base 211. In the illustrated example, two first via wirings 233V and two second via wirings 234V are provided; however, the quantity of first via wirings 233V may be one or three or more, and the quantity of second via wirings 234V may be one or three or more. Each of the through holes 233 and 234 has, for example, a circular shape, an elliptical shape, a rectangular shape, or the like in a top view.

The first lower metal part 232A partially overlaps with the metal film 261 in a top view. More specifically, the first lower metal part 232A overlaps with the recessed portion of the metal film 261 in a top view. The first lower metal part 232A does not overlap with the projecting portion of the metal film 261 in a top view. The first lower metal part 232A does not overlap with the upper metal part 231. The second lower metal part 232B partially overlaps with the upper metal part 231 in a top view. More specifically, the second lower metal part 232B overlaps with the recessed portion of the upper metal part 231 in a top view. The second lower metal part 232B does not overlap with the projecting portion of the upper metal part 231 in a top view. Further, the second lower metal part 232B partially overlaps with the metal film 261 in a top view. More specifically, the second lower metal part 232B overlaps with the entire projecting portion of the metal film 261 in a top view. Further, the second lower metal part 232B also overlaps with a portion of the recessed portion of the metal film 261. The third lower metal part 232C partially overlaps with the upper metal part 231 in a top view. More specifically, the third lower metal part 232C overlaps with the projecting portion of the upper metal part 231 in a top view. The third lower metal part 232C does not overlap with the recessed portion of the upper metal part 231 in a top view. The third lower metal part 232C does not overlap with the metal film 261 in a top view.

The first via wiring 233V is connected to the first lower metal part 232A. The metal film 261 is electrically connected to the first lower metal part 232A via the first via wiring 233V. The second via wiring 234V is connected to the second lower metal part 232B. The upper metal part 231 is electrically connected to the second lower metal part 232B via the second via wiring 234V. No via wiring may be connected to the third lower metal part 232C. The third lower metal part 232C may be electrically floated.

As illustrated in FIG. 6, a metal film 262 having a rectangular frame shape and surrounding the metal film 261 and the upper metal part 231 in a top view may be provided on the base 211. Further, in a top view, a metal adhesive 263 is applied to the upper surface of the metal film 262 to bond the cover 212, which will be described later. Examples of the metal adhesive 263 includes AuSn. The metal film 262 is spaced apart from the metal film 261 and the upper metal part 231 in a top view. In FIG. 6, the metal adhesive 263 is illustrated in a dot pattern for convenience.

Examples of the metal films 261 and 262 include Ni/Au (a metal film in which Ni and Au are stacked in this order) and Ti/Pt/Au (a metal film in which Ti, Pt, and Au are stacked in this order). The thickness of the metal film 262 can be the same as or similar to the thickness of the metal film 261.

(Cover 212)

The cover 212 includes a frame part 213 and an upper part 214. The frame part 213 has an upper surface 213a, a lower surface 213b, one or more inner lateral surfaces, and one or more outer lateral surfaces. The frame part 213 has, for example, a rectangular frame shape in a top view. The one or more inner lateral surfaces of the frame part 213 meet the upper surface 213a and extend downward from the upper surface 213a. The one or more outer lateral surfaces of the frame part 213 meet the upper surface 213a and the lower surface 213b of the frame part 213.

The upper part 214 has an upper surface 214a and a lower surface 214b. The upper part 214 has, for example, a flat plate shape. The upper surface 214a and the lower surface 214b may or may not be parallel to each other. Further, the upper part 214 has one or more lateral surfaces connected to the upper surface 214a and the lower surface 214b. The one or more lateral surfaces are connected to the outer edge of the upper surface 214a and the outer edge of the lower surface 214b. The upper part 214 is, for example, a rectangular parallelepiped or a cube. In this case, each of the upper surface 214a and the lower surface 214b of the upper part 214 has a rectangular shape, and the upper part 214 has four lateral surfaces each having a rectangular shape. The upper part 214 is not necessarily a rectangular parallelepiped or a cube. That is, the shape of the upper part 214 is not limited to a rectangular shape in a top view. The upper part 214 can have any shape such as a circular shape, an elliptical shape, a polygonal shape, or the like in a top view.

The frame part 213 and the upper part 214 are separately formed, and the upper surface 213a of the frame part 213 is bonded to the lower surface 214b of the upper part 214. For example, a metal adhesive may be used to bond the frame part 213 and the upper part 214. Examples of the metal adhesive include AuSn and a metal paste. A resin adhesive may be used to bond the frame part 213 and the upper part 214.

The frame part 213 can be formed of, for example, silicon as the main material. Other examples of the main material of the frame part 213 include sapphire, quartz, glass, and ceramic. As the ceramic, aluminum nitride, silicon nitride, aluminum oxide, or silicon carbide can be used. The upper part 214 can be formed of, for example, sapphire, quartz, silicon carbide, glass, silicon, or the like. The upper part 214 has a light transmitting region that transmits light having a predetermined wavelength. The entire upper part 214 may be a light transmitting region. The frame part 213 and the upper part 214 may be integrally formed of the same main material.

(Light Emitting Element 220)

The light emitting element 220 is, for example, a semiconductor laser element. The light emitting element 220 is not limited to a semiconductor laser element, and may be, for example, a light emitting diode (LED) or an organic light emitting diode (OLED). In the illustrated light emitting device 200, a semiconductor laser element is employed as the light emitting element 220.

The outer shape of the light emitting element 220 is, for example, a rectangle in a top view. Further, a lateral surface on one short side of two short sides of this rectangle serves as an emission end surface 220a of the light emitting element 220 from which light is emitted. The upper surface and the lower surface of the light emitting element 220 are larger in area than the emission end surface 220a. A metal film may be provided on the upper surface of the light emitting element 220. For example, wirings or the like for electrical conduction to other members are provided on the metal film. The metal film is not necessarily provided on the upper surface of the light emitting element 220.

An example in which the light emitting element 220 is a semiconductor laser element will be described. Light (laser light) emitted from the light emitting element 220 spreads and forms an elliptical far field pattern (hereinafter referred to as "FFP") on a plane parallel to the emission end surface. The FFP indicates the shape and the light intensity distribution of the emitted light at a position away from the emission end surface.

In the elliptical light emitted from the light emitting element 220, the direction passing through the major axis of the elliptical shape is defined as the fast axis direction of the FFP, and the direction passing through the minor axis of the elliptical shape is defined as the slow axis direction of the FFP. The fast axis direction of the FFP in the light emitting element 220 can correspond to the stacking direction in which a plurality of semiconductor layers including an active layer of the light emitting element 220 are stacked.

Further, light having an intensity of $1/e^2$ or more of the peak intensity within the light intensity distribution of the FFP of the light emitting element 220 is referred to as the main portion of light. An angle corresponding to an intensity of $1/e^2$ in the light intensity distribution is referred to as an angle of divergence. The angle of divergence in the fast-axis direction of the FFP is larger than the angle of divergence in the slow-axis direction of the FFP.

Further, light passing through the center of the elliptical shape of the FFP, in other words, light with the peak intensity in the light intensity distribution of the FFP, is referred to as light traveling along the optical axis or light passing through the optical axis. An optical path of light traveling along the center of the elliptical shape of the FFP is referred to as the optical axis of the light.

A light emitting element that emits visible light may be used as the light emitting element 220. Examples of the light emitting element that emits visible light include light emitting elements that emit blue light, green light, or red light. The light emitting elements that emit blue light, green light, or red light refer to light emitting elements in which emission peak wavelengths of emitted light are in a range of 405 nm to 494 nm, in a range of 495 nm to 570 nm, or in a range of 605 nm to 750 nm, respectively. Examples of the light emitting element 220 that emits blue light or green light include a semiconductor laser element including a nitride semiconductor. As the nitride semiconductor, for example, GaN, InGaN, or AlGaN can be used. Examples of the light emitting element 220 that emits red light include a semiconductor laser element including an InAlGaP-based semiconductor, a GaInP-based semiconductor, a GaAs-based semiconductor, or an AlGaAs-based semiconductor.

The emission peak of light emitted from the light emitting element 220 is not necessarily limited to the above. For example, light emitted from the light emitting element 220 may be visible light of any color other than the above-described colors. Further, a light emitting element that emits ultraviolet light, infrared light, or the like other than visible light may be used.

(Reflective Member 240)

The reflective member 240 has a lower surface, a reflective surface 240a that reflects incident light, and a plurality of lateral surfaces meeting the reflective surface 240a and the lower surface. In the illustrated light emitting device 200, each of the lower surface, the reflective surface 240a, and the plurality of lateral surfaces is a flat surface.

The plurality of lateral surfaces includes two opposite lateral surfaces on both sides of the reflective surface 240a. In addition, the plurality of lateral surfaces include one lateral surface that meets the two opposite lateral surfaces on both sides of the reflective surface 240a. The two opposite lateral surfaces on both sides of the reflective surface 240a may have the same area.

In the illustrated light emitting device 200, the reflective surface 240a has a rectangular shape. The reflective surface 240a is inclined with respect to the lower surface. The inclination angle of the reflective surface 240a with respect to the lower surface is 45 degrees, for example. When a specific inclination angle is described, a tolerance of ±5 degrees from the specific angle is allowed for products in consideration of manufacturing accuracy.

The lower surface and the reflective surface 240a may both be a curved surface, or may be a combination of a flat surface and a curved surface. The reflective surface 240a does not necessarily have a rectangular shape as long as the reflective surface 240a can reflect incident light in a desired direction.

Glass, metal, or the like can be used as the main material forming the outer shape of the reflective member 240. The main material is preferably a heat-resistant material, and, for example, glass such as quartz or BK7 (borosilicate glass), metal such as aluminum, or Si can be used. Further, the reflective surface 240a can be formed by using, for example, metal such as Ag or Al, or a dielectric multilayer film such as $Ta_2O_5/SiO_2$, $TiO_2/SiO_2$, or $Nb_2O_5/SiO_2$.

(Protective Element 250)

The protective element 250 is a component for protecting specific elements such as semiconductor laser elements. For example, the protective element 250 is a component for preventing specific elements such as semiconductor laser elements from being broken by an excessive current flowing therethrough. For example, a Zener diode formed of Si can be used as the protective element 250. Further, for example, the protective element 250 may be a component for measuring the temperature to ensure that specific elements do not fail due to the temperature environment. A thermistor can be used as such a temperature measuring element. The temperature measuring element may be disposed near the emission end surface of the light emitting element 220.

(Wiring 270)

The wiring 270 is composed of a conductor having a linear shape with both ends serving as bonding portions. In other words, the wiring 270 has, at both ends of the linear-shaped portion, bonding portions bonded to other components. The wiring 270 is used for electrical connection between two components. As the wiring 270, for example, a metal wiring can be used. Examples of the metal include gold, aluminum, silver, copper, and tungsten.

(Light Emitting Device 200)

Next, the light emitting device 200 will be described.

The light emitting element 220 is disposed on the upper surface 211a of the base 211. More specifically, the light emitting element 220 is disposed on the upper surface 211a of the base 211 with the upper metal part 231 being interposed therebetween. The light emitting element 220 is bonded to an upper surface 231a of the upper metal part 231. For example, the distance from the upper surface 211a of the base 211 to the lower surface of the light emitting element 220 can be set to 300 μm or less. For example, the light emitting element 220 includes a metal film on the lower surface thereof, and the metal film of the light emitting element 220 is bonded to a metal film provided on the upper surface 231a of the upper metal part 231. The metal films are bonded to each other via a metal adhesive, for example. Examples of the metal adhesive used to bond the metal films include AuSn. The thickness of the metal film provided on the lower surface of the light emitting element 220 and the thickness of the metal film provided on the upper surface 231a of the upper metal part 231 can be the same as or similar to the thickness of the metal film 261.

In the illustrated example, in a top view as seen in a perpendicular to the upper surface 211a of the base 211, the light emitting element 220 is laterally surrounded by the frame part 213. In the following, as used in the description of the light emitting device, the term "top view" refers to a top view as seen in a direction perpendicular to the upper surface 211a of the base 211, unless otherwise noted. The light emitting element 220 emits light laterally from the emission end surface 220a. In the illustrated example, the optical axis of the light emitted laterally from the emission end surface 220a is parallel to the first direction X. The light emitted from the light emitting element 220 is, for example, blue light. The light emitted from the light emitting element 220 is not limited to blue light. In the illustrated example, the light emitting element 220 is a semiconductor laser element.

The light emitting element 220 is disposed such that the emission end surface 220a faces the same direction as the lateral surface 231c of the upper metal part 231. The emission end surface 220a of the light emitting element 220 is perpendicular to the first direction X. Further, the emission end surface 220a of the light emitting element 220 can be parallel to/perpendicular to, for example, one inner lateral surface or one outer lateral surface of the frame part 213.

The light emitting element 220 is disposed on the upper surface 231a of the upper metal part 231 in a top view. More specifically, the light emitting element 220 is disposed on the upper surface of the projecting portion of the upper metal part 231. That is, the light emitting element 220 is disposed on the opposite side (on the negative side in the second Y direction) of the upper metal part 231 from the recessed portion. Further, in a top view, the light emitting element 220 overlaps with a virtual plane that overlaps with the lateral surface 231d of the recessed portion of the upper metal part 231 and that is parallel to the lateral surface 231d. In a top view, the light emitting element 220 does not overlap with the metal film 261. In a top view, the light emitting element 220 overlaps with a virtual line extending from the side 261d of the projecting portion of the metal film 261.

The reflective member 240 is disposed on the upper surface 211a of the base 211 without the upper metal part 231 being interposed therebetween. More specifically, the reflective member 240 is disposed on the metal film 261 provided directly under the reflective member 240. The lower surface of the reflective member 240 is positioned lower than the upper surface 231a of the upper metal part 231. The reflective member 240 includes a metal film on the lower surface thereof, and the metal film of the reflective member 240 and the metal film 261 are bonded to each other via a metal adhesive, for example. Examples of the metal adhesive used to bond the metal films include AuSn. The thickness of the metal film provided on the lower surface of the reflective member 240 can be the same as or similar to the thickness of the metal film 261.

The reflective member 240 disposed on the upper surface 211a of the base 211 faces the light emitting element 220. The reflective member 240 has the reflective surface 240a. The reflective surface 240a of the reflective member 240 faces the emission end surface 220a of the light emitting element 220. The reflective surface 240a upwardly reflects light emitted from the emission end surface 220a of the light emitting element 220.

The reflective member 240 is disposed on the recessed portion of the metal film 261. The reflective member 240 does not overlap with the projecting portion of the metal film 261 in a top view. The end point of the reflective member 240 closest to the upper metal part 231 is located on the positive side in the first direction X relative to the end point of the projecting portion of the metal film 261 closest to the upper metal part 231. The reflective member 240 does not overlap with the upper metal part 231 in a top view.

As illustrated in FIG. 5, at least a portion of the first lower metal part 232A overlaps with the reflective member 240 in a bottom view. Conversely, the second lower metal part 232B does not overlap with the reflective member 240 in a bottom view. With this configuration, in a bottom view, the first lower metal part 232A and the second lower metal part 232B that extends in the optical axis direction can be arranged adjacent to each other at a predetermined interval in a direction perpendicular to the optical axis. In the illustrated example, the optical axis direction coincides with the first direction X, and the direction perpendicular to the optical axis coincides with the second direction Y.

Figure 18:
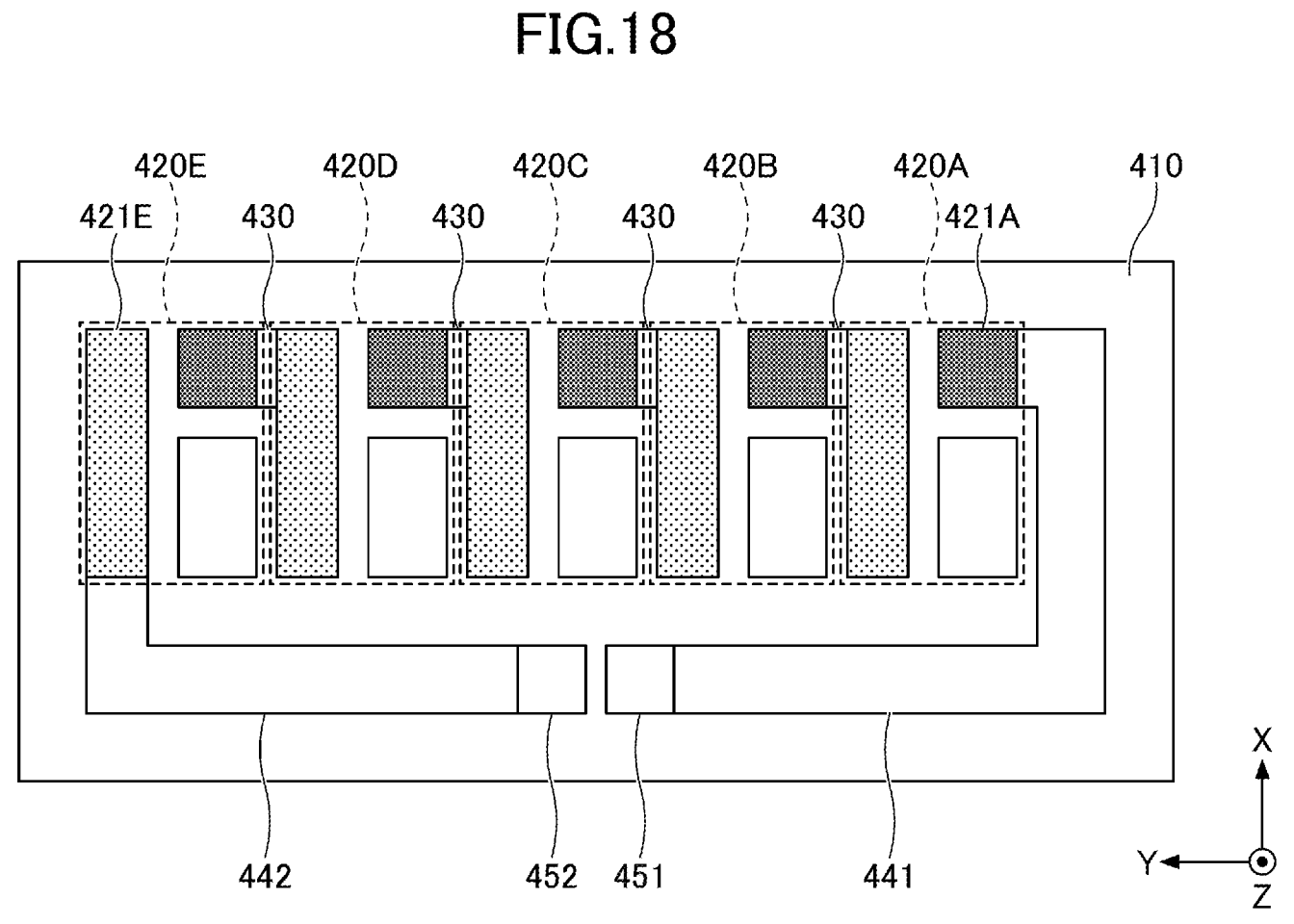
Figure 21:
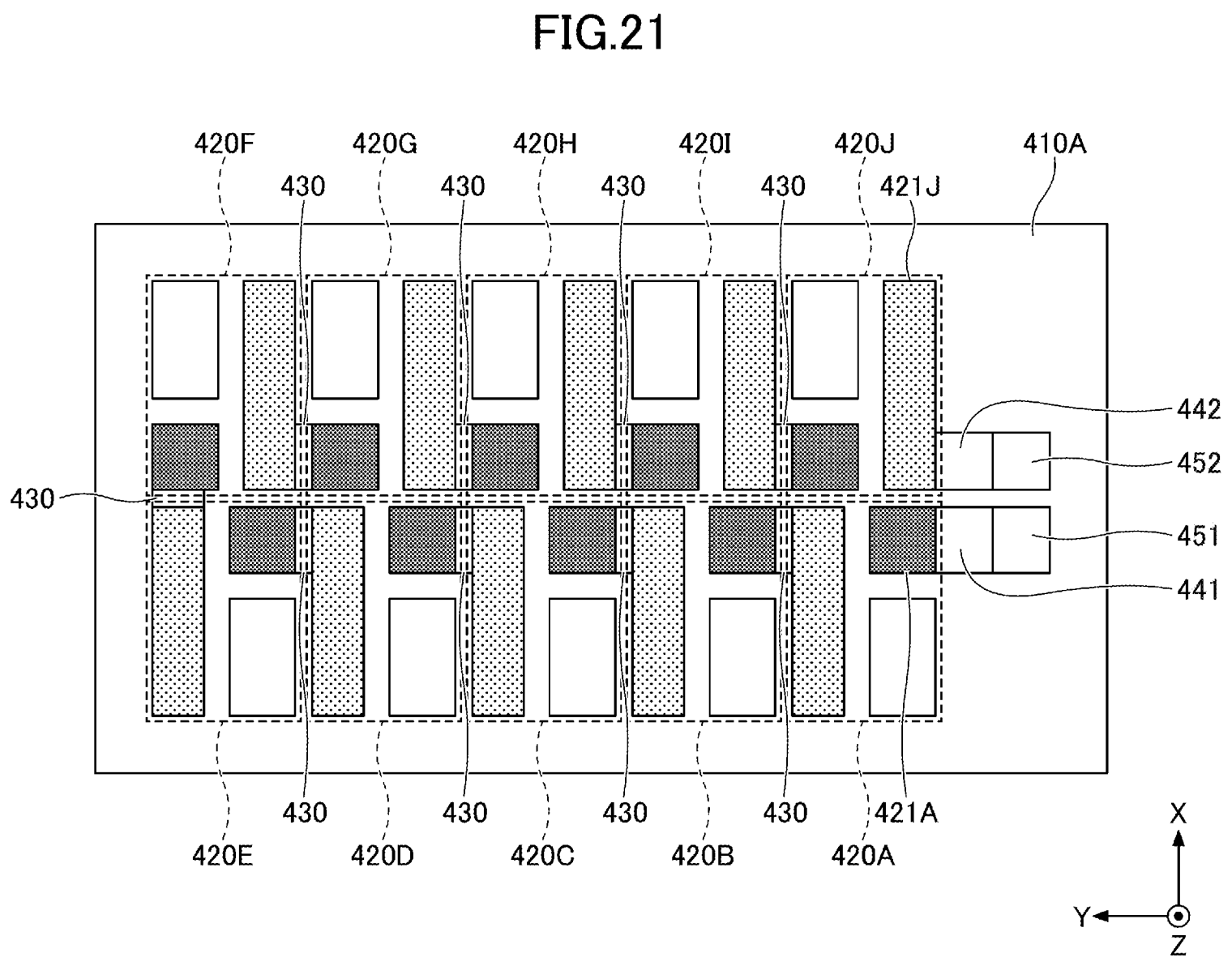

With such a positional relationship between the first lower metal part 232A and the second lower metal part 232B, in a case where a plurality of light emitting devices 200 are arranged on a wiring substrate in a direction perpendicular to the traveling direction of emitted light (the optical axis direction) as illustrated in FIG. 18 and FIG. 21, which will be described later, wiring patterns on which the plurality of light emitting devices 200 are connected in series can be easily formed on the wiring substrate.

As illustrated in FIG. 6, a first connecting portion between the first via wiring 233V and the metal film 261 overlaps with the reflective member 240 in a top view. The first connecting portion is the end surface on the metal film 261 side of the first via wiring 233V.

As illustrated in FIG. 5, at least a portion of the third lower metal part 232C preferably overlaps with the light emitting element 220 in a bottom view. Accordingly, the third lower metal part 232C can function as a heat dissipation member, and heat from the light emitting element 220 can be efficiently dissipated. That is, by disposing the third lower metal part 232C directly under the light emitting element 220, heat generated from the light emitting element 220 can be transferred to the third lower metal part 232C through the base 211, and can be dissipated from the third lower metal part 232C. The entire light emitting element 220 preferably overlaps with the third lower metal part 232C in a bottom view. Accordingly, dissipation of heat generated from the light emitting element 220 can be further improved. In addition, the second lower metal part 232B overlaps with the recessed portion of the upper metal part 231 in a top view. Thus, the second lower metal part 232B also contributes to the improvement of dissipation of heat generated from the light emitting element 220.

The distance from the negative side in the second direction Y, of the two sides of the projecting portion of the upper metal part 231 opposing to each other in the second direction Y, to the light emitting element 220 is less than the distance from the positive side in the second direction Y to the light emitting element 220. Accordingly, the size of the light emitting device 200 in the second direction Y can be reduced by disposing the light emitting element 220 close to the negative side in the second direction Y. Further, in the bottom view, the distance from the negative side in the second direction Y, of the two sides of the third lower metal part 232C opposite to each other in the second direction Y, to the light emitting element 220 is greater than the distance from the positive side in the second direction Y to the light emitting element 220. By disposing the third lower metal part 232C as described above, the size of the light emitting device 200 in the second direction Y can be reduced.

The total thickness (T1+T2) of the upper metal part 231 and the lower metal part 232 in the third direction Z is preferably greater than the thickness T3 of the base 211. The height of the light emitting element 220 can be sufficiently raised by increasing the thickness T1. Further, stress applied to the upper metal part 231 and the lower metal part 232 can be balanced by making the thickness T2 the same as or similar to the thickness T1. By making the thickness T3 of the base 211 less than the total thickness (T1+T2) of the metal parts, the proportion of the metal parts having higher thermal conductivity in a heat dissipation path of heat generated from the light emitting element 220 can be increased. Accordingly, heat generated from the light emitting element 220 can be efficiently dissipated.

As illustrated in FIG. 6, a second connecting portion between the second via wiring 234V and the upper metal part 231 does not overlap with the light emitting element 220 in a top view. The second connecting portion is the end surface on the upper metal part 231 side of the second via wiring 234V. By providing the second via wiring 234V such that the second connecting portion does not overlap with the light emitting element 220 in a top view, the flatness of the upper surface 211a of the base 211, where the projecting portion of the upper metal part 231 located directly under the light emitting element 220 is disposed, can be easily ensured. Further, the second connecting portion is located so as to overlap the light reflective member 240 in a top view. Thus, the third lower metal part 232C can be disposed so as to increase the overlapping area of the third lower metal part 232C and the light emitting element 220 in a bottom view. Accordingly, heat from the light emitting element 220 can be easily and efficiently dissipated.

Further, in the light emitting device 200, the thickness T1 of the upper metal part 231, on which the light emitting element 220 is disposed, is 150 μm or more and 250 μm or less. The thickness of the metal film 261 on which the reflective member 240 is disposed is less than one-third of the thickness T1. The thickness of the metal film 261 can be, for example, less than 50 μm or less. The length from the upper surface 231a of the upper metal part 231 to the upper surface of the metal film 261 in the third direction Z is, for example, 130 μm or more and 250 μm or less.

As illustrated in FIG. 7, a distance L1 between the emission end surface 220a and a first point P1 on the reflective surface 240a closest to the emission end surface 220a in the first direction X is less than or equal to the thickness T1 of the upper metal part 231 in the third direction Z. The distance L1 is, for example, 250 μm or less.

In the light emitting device 200, by causing the distance L1 between the emission end surface 220a and the first point P1 to be less than or equal to the thickness T1 of the upper metal part 231, the light emitting element 220 and the reflective member 240 can be positioned close to each other in the first direction X.

Accordingly, the lower surface of the light emitting element 220 is positioned higher than the lower surface of the reflective member 240, as measured from the upper surface 211a of the base 211. Therefore, of light that spreads from the light emitting element 220, a larger amount of light directed downward with respect to the optical axis OA can be incident on the reflective surface 240a of the reflective member 240. In particular, the thickness of the metal film 261 is less than one-third of the thickness of the upper metal part 231 in the third direction Z. Thus, a sufficient height difference can be ensured between the lower surface of the light emitting element 220 and the lower surface of the reflective member 240. Of light that spreads from the light emitting element 220, the main portion of light directed downward with respect to the optical axis OA can be incident on the reflective surface 240a of the reflective member 240. Further, a height raising member such as a submount does not need to be provided between the light emitting element 220 and the upper surface 211a of the base 211 in order for the lower surface of the light emitting element 220 to be positioned higher than the lower surface of the reflective member 240, thereby contributing to a reduction in the quantity of members and a reduction in manufacturing costs. Further, because the distance between the light emitting element 220 and the reflective member 240 in the first direction X can be decreased, the size of the light emitting device 200 in the first direction X can be reduced.

By setting the thickness of the upper metal part 231 to 150 μm or more, the lower surface of the light emitting element 220 can be made sufficiently high with respect to the upper surface 211a of the base 211. By setting the thickness of the upper metal part 231 to 250 μm or less, the height of the light emitting element 220 can be lowered with respect to the upper surface 211a of the base 211, thereby reducing the size of the light emitting device 200 in the third direction Z.

As illustrated in FIG. 7, a portion of the reflective surface 240*a* is positioned lower than the upper surface 231*a* of the upper metal part 231. Of the main portion of light emitted from the emission end surface 220*a*, light directed downward with respect to the optical axis OA reaches a portion of the reflective surface 240*a* located below a middle point P2 in the third direction Z. The light directed downward with respect to the optical axis OA does not reach a portion of the reflective surface 240*a* located above the middle point P2. That is, the light directed downward with respect to the optical axis OA reaches the reflective surface 240*a* before reaching the upper surface 211*a* of the base 211, and thus, the light directed downward with respect to the optical axis OA is not emitted to a portion of the reflective surface 240*a* located above the middle point P2 by being reflected by the upper surface 211*a* of the base 211.

When the main portion of light directed downward with respect to the optical axis OA reaches the reflective surface 240*a*, the distance between the lowest point in a light irradiation region of the reflective surface 240*a* and an emission point on the emission end surface 220*a* is 0.7 times or more and 1.3 times or less the thickness T1 of the upper metal part 231.

As illustrated in FIG. 8, the emission end surface 220*a* can protrude further toward the reflective member 240 from the lateral surface 231*c* of the upper metal part 231 in the first direction X. Accordingly, the upper surface of the upper metal part 231 is less likely to be irradiated with light emitted from the emission end surface 220*a*. As described, in a case where the emission end surface 220*a* is closer to the reflective member 240 relative to the lateral surface 231*c*, a distance L2 between the lateral surface 231*c* of the upper metal part 231 and the emission end surface 220*a* in the first direction X is 0 μm or more and 50 μm or less.

As illustrated in FIG. 9, the lateral surface 231*c* of the upper metal part 231 can be closer to the reflective member 240 relative to the emission end surface 220*a*. With this arrangement, the entire light emitting element 220 can be disposed on the upper surface of the upper metal part 231 in a top view. Thus, heat from the light emitting element 220 can be efficiently dissipated. As described, in a case where the lateral surface 231*c* is closer to the reflective member 240 relative to the emission end surface 220*a*, a distance L3 between the lateral surface 231*c* of the upper metal part 231 and the emission end surface 220*a* in the first direction X is, for example, 0 μm or more and 30 μm or less.

As illustrated in FIG. 3, the metal film 261 extends from directly under the reflective member 240 to the vicinity of the reflective member 240. One or more wirings 270 electrically connected to the light emitting element 220 are bonded to the upper surface of the metal film 261 on which the reflective member 240 is disposed. In addition, a wiring 270 electrically connected to the protective element 250 is bonded to the upper surface of the metal film 261. That is, in the light emitting device 200, the light emitting element 220 and the protective element 250 are electrically connected to the metal film 261 on the base 211 by a plurality of wirings 270.

The protective element 250 is disposed on the projecting portion of the upper metal part 231. On the upper surface of the projecting portion, the protective element 250 is located on the recessed portion side (on the positive side in the second direction Y) relative to the light emitting element 220. In a top view, the protective element 250 is disposed closer to the second connecting portion between the second via wiring 234V and the upper metal part 231 than the light emitting element 220 is. Accordingly, a function to protect the light emitting element 220 can be improved.

At least a portion of the metal film 261 may be located on the light emitting element 220 side (on the negative side in the first direction X) relative to the lateral surface 231*c*, facing the reflective member 240, of the upper metal part 231. More specifically, a portion of the projecting portion of the metal film 261 is located on the light emitting element 220 side relative to the lateral surface 231*c* of the upper metal part 231. Accordingly, the wirings 270 connecting the metal film 261 to the light emitting element 220 and the wiring 270 connecting the metal film 261 to the protective element 250 can be short.

In the example illustrated in FIG. 3, a plurality of wirings 270 are bonded to the light emitting element 220. The plurality of wirings 270 include a first wiring. One end of the first wiring is bonded to the upper surface of the light emitting element 220, and the other end of the first wiring is bonded to the projecting portion on the reflective member 240 side of the metal film 261 (on the positive side in the first direction X) relative to the side 261*c*. In addition, the plurality of wirings 270 include a second wiring. One end of the second wiring is bonded to the upper surface of the light emitting element 220, and the other end of the second wiring is bonded to the projecting portion on the light emitting element 220 side of the metal film 261 (on the negative side in the first direction X) relative to the side 261*c*.

An angle between a straight line connecting both ends of the first wiring and a straight line parallel to the optical axis of light emitted from the light emitting element 220 is 30 degrees or more and 70 degrees or less. By setting the angle to 30 degrees or more, interference of the first wiring with the light emitted from the light emitting element 220 onto the reflective surface 240*a* of the reflecting member 240 can be suppressed. By setting the angle to 70 degrees or less, an increase in the size of the projecting portion of the metal film 261, to which the plurality of wirings 270 including the first wiring and the second wiring are bonded, can be suppressed.

In the example illustrated in FIG. 3, the wiring 270 is bonded to the protective element 250. One end of the wiring 270 is bonded to the protective element 250, and the other end of the wiring 270 is bonded to the projecting portion on the light emitting element 220 side of the metal film 261 relative to the side 261*c* in the first direction X. The wiring 270 is bonded to the projecting portion on the emission end surface 220*a* side of the metal film 261 (on the negative side in the first direction X) relative to the first wiring. In addition, the wiring 270 is bonded to the projecting portion on the light emitting element 220 side of the metal film 261 (on the negative side in the first direction X) relative to the second wiring.

For the electrical connection between the light emitting element 220 and an external power source, the first lower metal part 232A and the second lower metal part 232B provided on the lower surface 211*b* of the base 211 can be used, for example.

The lower surface 213*b* of the frame part 213 of the cover 212 is bonded to the outer edge of the upper surface 211*a* of the base 211. For example, a metal film provided on the lower surface 213*b* of the frame part 213 is bonded and fixed to the metal film 262 provided on the upper surface 211*a* of the base 211 via the metal adhesive 263. By bonding the cover 212 to the base 211, a sealed space surrounded by the base 211, the frame part 213, and the upper part 214 is formed. The sealed space may be formed to be airtight. The airtightly sealed space can suppress collection of dust such as organic substances on the emission end surface 220a of the light emitting element 220.

The upper part 214 of the cover 212 has the light transmitting region through which light reflected upward of the reflective member 240 is transmitted and emitted to the outside. That is, light reflected upward of the reflective member 240 is transmitted through the light transmitting region of the upper part 214 and is emitted from the upper surface 214a to the outside of the light emitting device 200. The entire upper part 214 may be the light transmitting region. The light transmitting region of the upper part 214 transmits 70% or more of light reflected upward of the reflective member 240.

The length of the light emitting device 200 in the first direction X is, for example, 2500 μm or more and 4000 μm or less. The length of the light emitting device 200 in the second direction Y is, for example, 1800 μm or more and 2500 μm or less. The length of the light emitting device 200 in the third direction Z is, for example, 1800 μm or more and 2100 μm or less. The light emitting device 200 according to the present disclosure is a light emitting device suitable for size reduction. Further, the light emitting device 200 can be designed to not include a heat dissipation member such as a submount in addition to the metal parts and the base. Accordingly, the quantity of members of the light emitting device 200 can be reduced. As a result, the productivity of manufacturing the light emitting device 200 can be improved.

Second Embodiment

Next, a light emitting device 300 according to a second embodiment will be described with reference to FIG. 10 through FIG. 15. The light emitting device 300 according to the second embodiment differs from the light emitting device 200 according to the first embodiment in that the light emitting device 300 includes a plurality of light emitting elements 320 and a plurality of reflective members 340, and further includes a plurality of upper metal parts 331 provided on a base 211A.

Figure 10:
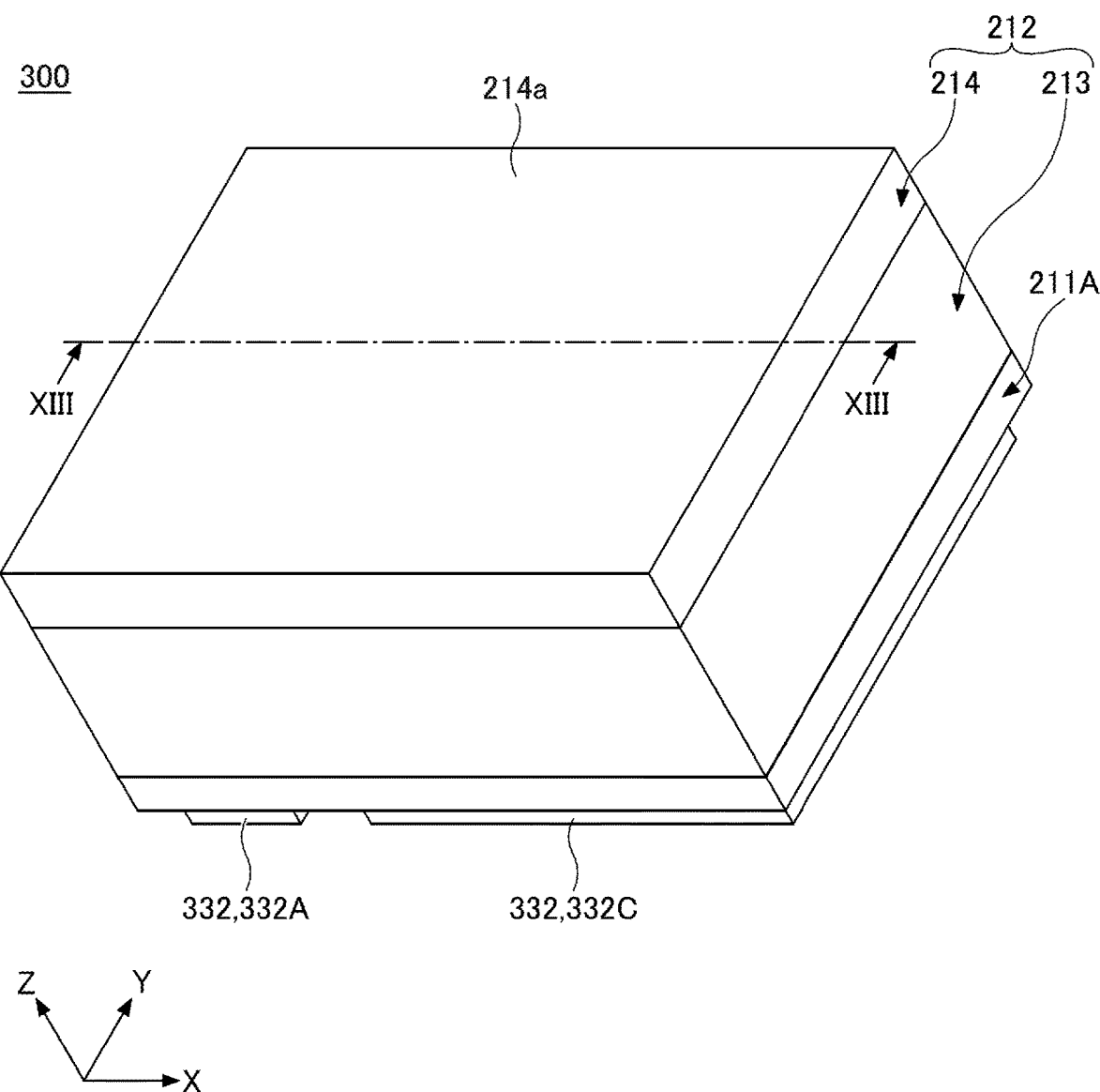
FIG. 10 is a perspective view of a light emitting device according to a second embodiment.
Figure 11:
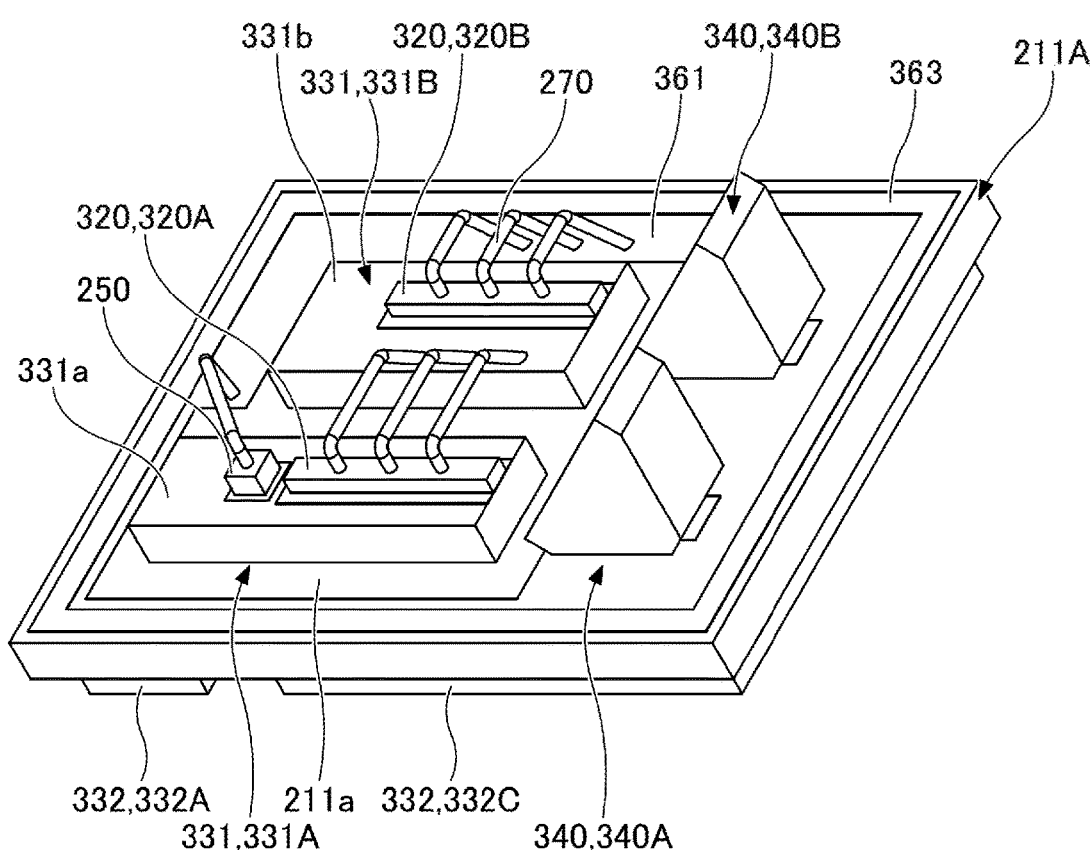
FIG. 11 is a perspective view of the light emitting device illustrated in FIG. 10, from which a cover is removed.
Figure 11:
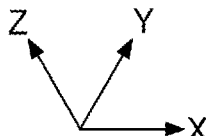
Figure 12:
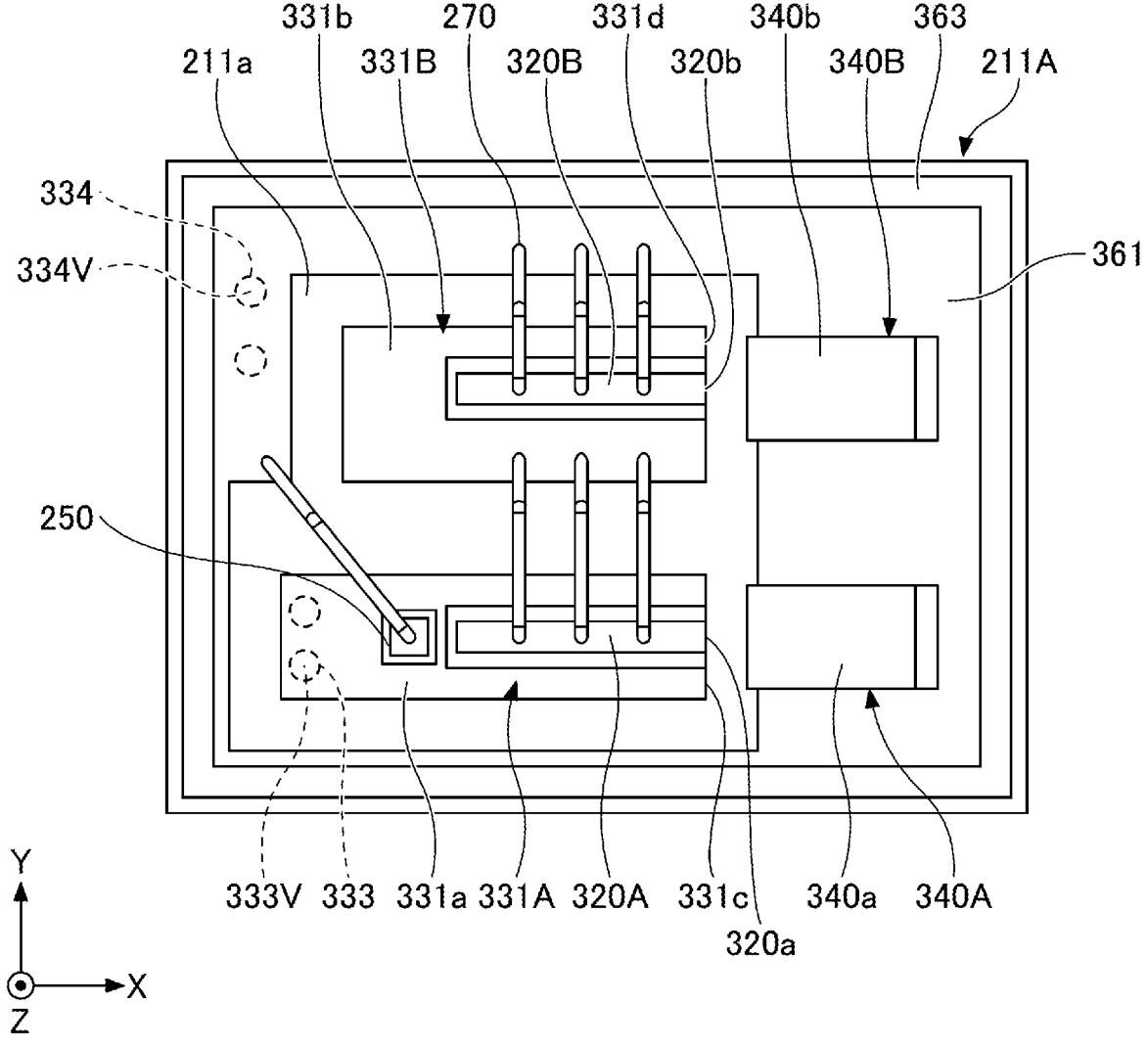
FIG. 12 is a top view of the light emitting device illustrated in FIG. 10, from which the cover is removed.
Figure 13:
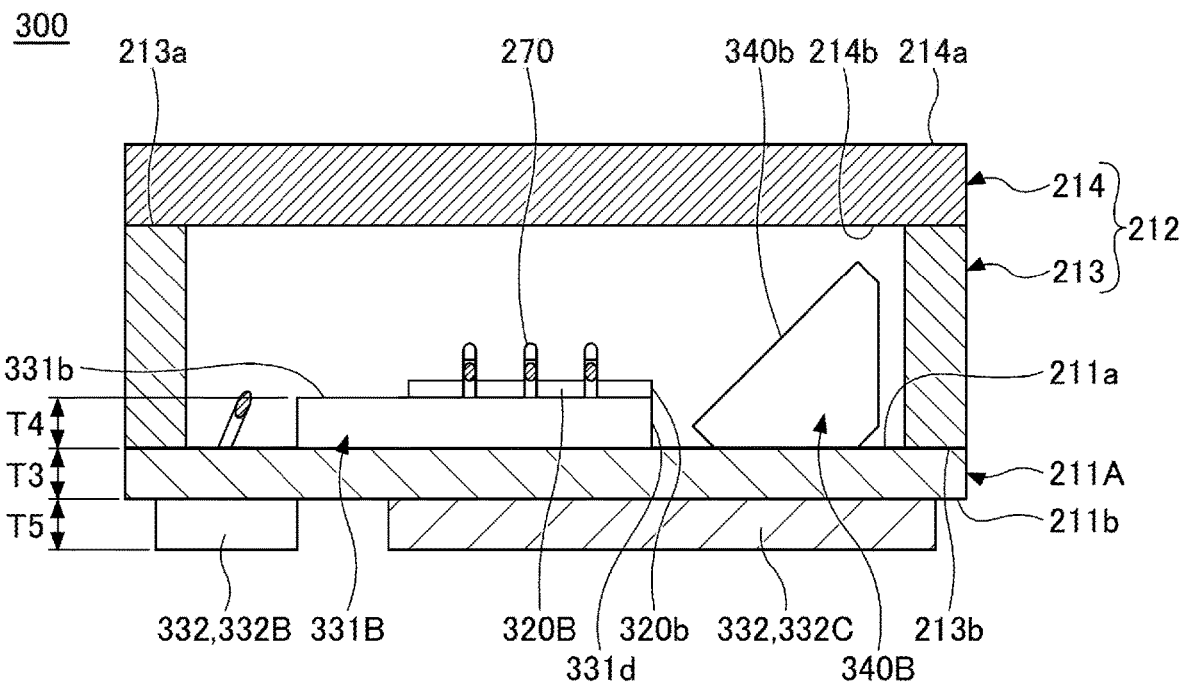
FIG. 13 is a cross-sectional view of the light emitting device taken through a cross-sectional line XIII-XIII of FIG. 10.
Figure 13:
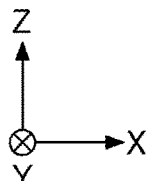
Figure 14:
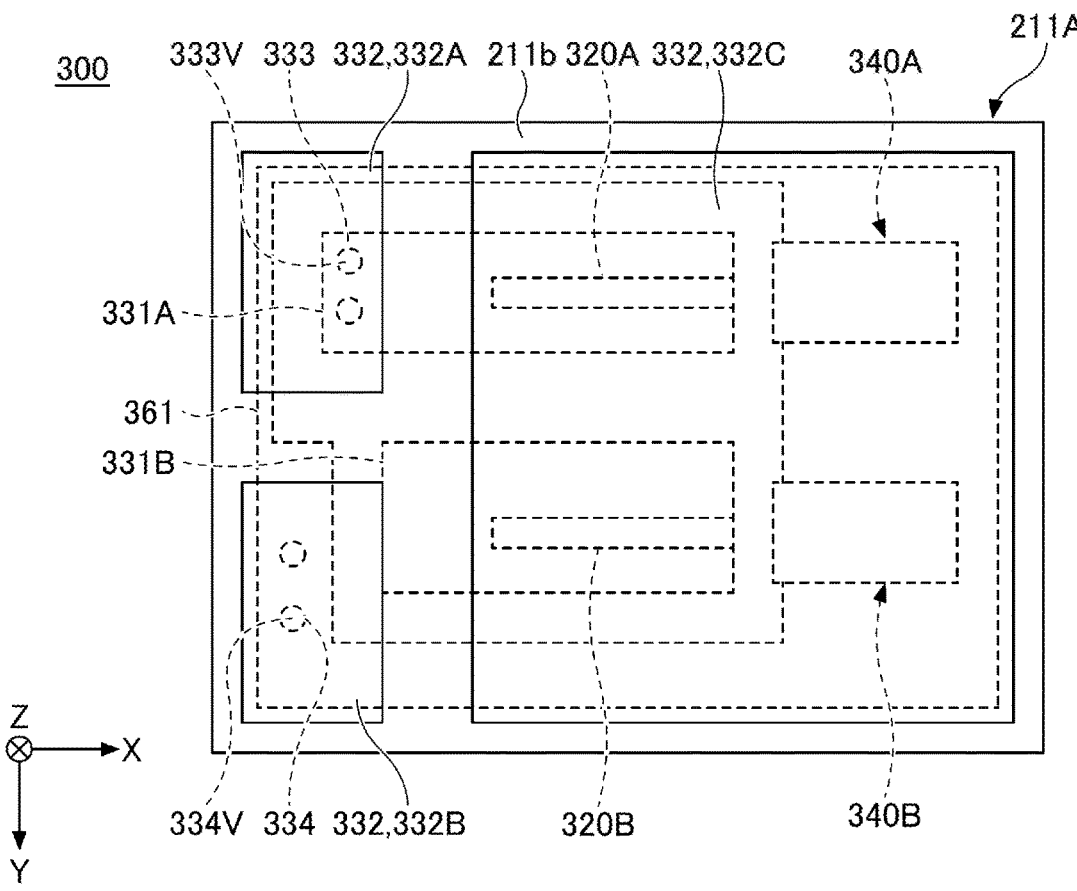
FIG. 14 is a bottom view of the light emitting device according to the second embodiment.
Figure 15:
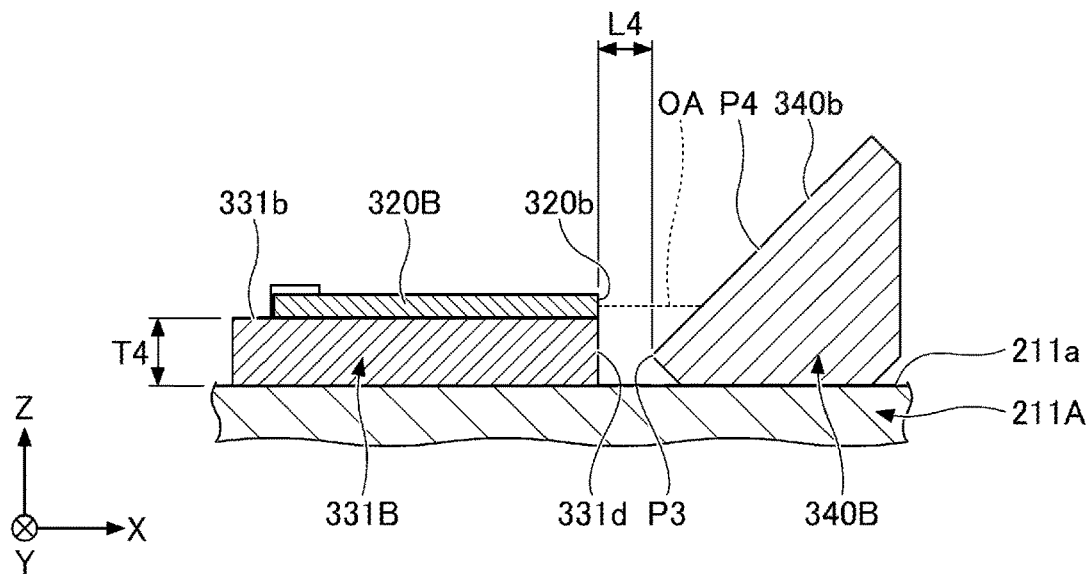
FIG. 15 is an enlarged cross-sectional view of a second light emitting element, a second reflective member, and their surroundings in the light emitting device illustrated in FIG. 13.

FIG. 10 is a perspective view of the light emitting device 300 according to the second embodiment. FIG. 11 is a perspective view of the light emitting device 300 illustrated in FIG. 10, from which a cover 212 is removed. FIG. 12 is a top view of the light emitting device 300 illustrated in FIG. 10, from which the cover 212 is removed. FIG. 13 is a cross-sectional view of the light emitting device 300 taken through a cross-sectional line XIII-XIII of FIG. 10. FIG. 14 is a bottom view of the light emitting device 300 according to the second embodiment. FIG. 15 is an enlarged cross-sectional view of a second light emitting element 320B, a second reflective member 340B, and their surroundings in the light emitting device 300 illustrated in FIG. 13.

First members will be described. The description of members shared with the first embodiment will be omitted as appropriate.

(Plurality of Light Emitting Elements 320)

Similar to the light emitting element 220 according to the first embodiment, the plurality of light emitting elements 320 are, for example, semiconductor laser elements. The plurality of light emitting elements 320 include a first light emitting element 320A and the second light emitting element 320B. The first light emitting element 320A and the second light emitting element 320B may emit light of the same color or may emit light of different colors from each other. The plurality of light emitting elements are not limited to semiconductor laser elements, and may be, for example, light emitting diodes (LEDs), organic light emitting diodes (OLEDs), or the like. The quantity of light emitting elements 320 is not limited two. In addition to the first light emitting element 320A and the second light emitting element 320B, additional light emitting element(s) may be further included.

(Plurality of Reflective Members 340)

Each of the reflective members 340 has a lower surface, a reflective surface that reflects incident light, and a plurality of lateral surfaces meeting the reflective surface and the lower surface. In the illustrated light emitting device 300, each of the lower surface, the reflective surface, and the plurality of lateral surfaces is a flat surface. The outer shape and the material of each of the reflective members 340 may be the same as those of the reflective member 240. In the illustrated example, the plurality of reflective members 340 include a first reflective member 340A and the second reflective member 340B.

(First Upper Metal Part 331A and Second Upper Metal Part 331B)

The first upper metal part 331A and the second upper metal part 331B are provided on the upper surface 211a of the base 211A, and are spaced apart from each other. A thickness T4 of the first upper metal part 331A can be, for example, 150 μm or more and 250 μm or less. The thickness of the second upper metal part 331B can be the same as the thickness of the first upper metal part 331A. The material of each of the first upper metal part 331A and the second upper metal part 331B may be the same as the material of the upper metal part 231 of the first embodiment, for example.

Each of the first upper metal part 331A and the second upper metal part 331B of the illustrated light emitting device 300 has a rectangular shape in a top view. The first upper metal part 331A is longer than the second upper metal part 331B in the long side direction of the upper surface 211a of the base 211A (in the first direction X). The first upper metal part 331A is shorter than the second upper metal part 331B in the short side direction of the upper surface 211a (in the second direction Y). In the illustrated example, the first upper metal part 331A is located on the negative side in the second direction Y relative to the second upper metal part 331B. A third via wiring 333V is provided in a through hole 333 penetrating the base 211A, and is connected to the first upper metal part 331A at a third connecting portion.

(Lower Metal Parts 332)

One or more lower metal parts 332 may be provided on the lower surface 211b of the base 211A. When the lower metal parts 332 are provided on the lower surface 211b of the base 211A, the thickness T5 of each of the lower metal parts 332 is preferably 0.8 times or more and 1.2 times or less the thickness T4 of the first upper metal part 331A (or the second upper metal part 331B). Accordingly, the same effects as those of the lower metal parts 232 according to the first embodiment can be obtained. Further, the total thickness (T4+T5) of the first upper metal part 331A (or the second upper metal part 331B) and any of the one or more lower metal parts 332 is preferably greater than the thickness T3 of the base 211A in the third direction Z.

In the illustrated example, a plurality of lower metal parts 332 including a first lower metal part 332A, a second lower metal part 332B, and a third lower metal part 332C are provided on the lower surface 211b of the base 211A. As illustrated in FIG. 14, the first lower metal part 332A and the second lower metal part 332B are both located close to one of the two short sides of the lower surface 211b in a bottom view. Further, the first lower metal part 332A and the second lower metal part 332B face each other in the short side direction of the base 211A (in the second direction Y). In the illustrated example, the first lower metal part 332A is located on the negative side in the first direction X and on the negative side in the second direction Y, on the lower surface 211*b*. The second lower metal part 332B is located on the negative side in the first direction X on the lower surface 211*b*, and is located on the positive side in the second direction relative to the first lower metal part 332A. The first lower metal part 332A and the second lower metal part 332B may have the same size in the first direction X and the second direction Y.

In a bottom view, the third lower metal part 332C is disposed to face the first lower metal part 332A and the second lower metal part 332B in the long side direction of the lower surface 211*b* (in the first direction X). More specifically, the third lower metal part 332C is disposed on the positive side in the first direction X on the lower surface 211*b*, and is face the first lower metal part 332A and the second lower metal part 332B in the first direction X. Further, in a bottom view, the third lower metal part 332C is spaced apart from the first lower metal part 332A and the second lower metal part 332B in the first direction X. The third lower metal part 332C is longer than each of the first lower metal part 332A and the second lower metal part 332B in the long side direction of the lower surface 211*b* (in the first direction X) and the short side direction of the lower surface 211*b* (in the second direction Y). Further, in a bottom view, the area of the third lower metal part 332C is larger than the total area of the first lower metal part 332A and the second lower metal part 332B. In order to improve the heat dissipation performance, the area of the lower metal part 332C is preferably larger than half the area of the lower surface 211*b* of the base 211A.

In a top view (or in a bottom view), at least a portion of the first upper metal part 331A overlaps with the first lower metal part 332A. Further, in a top view, at least a portion of the first upper metal part 331A overlaps with the third lower metal part 332C. In a top view, the first upper metal part 331A does not overlap with the second lower metal part 332B. In a top view, at least a portion of the second upper metal part 331B overlaps with the second lower metal part 332B. In a top view, at least a portion of the second upper metal part 331B overlaps with the third lower metal part 332C. In a top view, the second upper metal part 331B does not overlap with the first lower metal part 332A.

(Metal Film 361)

A metal film 361 is provided on the upper surface 211*a* of the base 211A. In a top view, the thickness of the metal film 361 may be the same as the thickness of the metal film 261 of the first embodiment. Further, a metal adhesive 363 is provided on the upper surface of the metal film 361. For example, AuSn can be used as the metal adhesive 363. In a top view, the metal film 361 is provided so as to surround the first upper metal part 331A and the second upper metal part 331B. In a top view, the metal film 361 does not overlap with the first upper metal part 331A and the second upper metal part 331B.

A fourth via wiring 334V is provided in a through hole 334 penetrating the base 211A, and is connected to the metal film 361 at a fourth connecting portion. In a top view, the fourth connecting portion does not overlap with the first upper metal part 331A. In a top view, the fourth connecting portion does not overlap with the second upper metal part 331B.

The third via wiring 333V connected to the first upper metal part 331A is connected to the first lower metal part 332A. In a bottom view, the third connecting portion overlaps with the first lower metal part 332A. Further, the fourth via wiring 334V connected to the metal film 361 is connected to the second lower metal part 332B. In a bottom view, the fourth connecting portion overlaps with the second lower metal part 332B. No via wiring may be connected to the third lower metal part 332C. In a bottom view, the third connecting portion does not overlap with the third lower metal part 332C. In a bottom view, the fourth connecting portion does not overlap with the third lower metal part 332C. The third lower metal part 332C may be electrically floated.

(Light Emitting Device 300)

Next, the light emitting device 300 will be described.

The first light emitting element 320A is disposed on the upper surface 211*a* of the base 211A with the first upper metal part 331A interposed therebetween, and the second light emitting element 320B is disposed on the upper surface 211*a* of the base 211A with the second upper metal part 331B interposed therebetween. For example, the first light emitting element 320A includes a metal film on the lower surface thereof, and the first upper metal part 331A includes a metal film on an upper surface 331*a* thereof. Further, the second light emitting element 320B includes a metal film on the lower surface thereof, and the second upper metal part 331B includes a metal film on an upper surface 331*b* thereof. These corresponding metal films are bonded to each other via a metal adhesive. Examples of the metal adhesive used to bond the metal films include AuSn.

The first light emitting element 320A and the second light emitting element 320B emit light laterally from the first emission end surface 320*a* and the second emission end surface 320*b*, respectively. The first emission end surface 320*a* and the second emission end surface 320*b* face the same direction. In the illustrated example, the optical axis of light emitted from the first light emitting element 320A and the optical axis of light emitted from the second light emitting element 320B can be parallel to each other. Further, the first emission end surface 320*a* and the second emission end surface 320*b* can be parallel to each other. As used herein, the term "parallel" means that a tolerance of ±5 degrees is allowed. The distance between the first emission end surface 320*a* and the second emission end surface 320*b* in the optical axis direction of light emitted from the first light emitting element 320A (in the first direction X) can be, for example, 50 μm or less. Further, the first emission end surface 320*a* and the second emission end surface 320*b* can be parallel to/perpendicular to, for example, one inner lateral surface or one outer lateral surface of the frame part 213.

One lateral surface of the two lateral surfaces meeting the second emission end surface 320*b* of the second light emitting element 320B faces one lateral surface of the two lateral surfaces meeting the first emission end surface 320*a* of the light emitting element 320A. In a top view, the two lateral surfaces meeting the second emission end surface 320*b* of the second light emitting element 320B and the two lateral surfaces meeting the first emission end surface 320*a* of the light emitting element 320A are parallel to the first direction X.

The length of the first light emitting element 320A and the length of the second light emitting element 320B are less than the length of the second upper metal part 331B in the first direction X. Further, the difference in length between the first light emitting element 320A and the second light emitting element 320B in the first direction X is 50 μm or less. The distance between the lateral surface of the first upper metal part 331A on the first reflective member 340A side and the lateral surface of the second upper metal part 331B on the second reflective member 340B side in the first direction X is 100 µm or less. Further, the distance between the lateral surface of the first upper metal part 331A on the side opposite the first reflective member 340A and the lateral surface of the second upper metal part 331B on the side opposite the second reflective member 340B in the first direction X is 200 µm or more.

The metal film 361 surrounding the plurality of upper metal parts 331 has a projecting portion. The projecting portion projects toward the second upper metal part 331B and is provided on the side of the metal film 361 opposite the plurality of reflective members 340. The projecting portion of the metal film 361 is provided on the second upper metal part 331B side in the second direction Y. The above-described fourth via wiring 334V is provided directly under the projecting portion of the metal film 361.

The first reflective member 340A and the second reflective member 340B are disposed on the metal film 361 provided on the upper surface 211a of the base 211A. For example, each of the first reflective member 340A and the second reflective member 340B includes a metal film on the lower surface thereof. The metal film of each of the first reflective member 340A and the second reflective member 340B is bonded to the metal film 361 via a metal adhesive. Examples of the metal adhesive used to bond the metal films include AuSn.

The first reflective member 340A is disposed to face the first light emitting element 320A. More specifically, the first reflective member 340A is disposed such that a reflective surface 340a faces the first emission end surface 320a of the first light emitting element 320A. The second reflective member 340B is disposed to face the second light emitting element 320B. More specifically, the second reflective member 340B is disposed such that a reflective surface 340b faces the second emission end surface 320b of the second light emitting element 320B. The reflective surface 340b faces the same direction as the reflective surface 340a of the first reflective member 340A. Each of the first reflective member 340A and the second reflective member 340B is disposed with the longer side being along the first direction X, and the first reflective member 340A and the second reflective member 340B are spaced apart from each other. The reflective surface 340b upwardly reflects light emitted from the second emission end surface 320b of the second light emitting element 320B.

The second upper metal part 331B has a lateral surface 331d facing the second reflective member 340B. The lateral surface 331d faces the same direction as the second emission end surface 320b. The second upper metal part 331B is spaced apart from the first upper metal part 331A in a direction (the second direction Y) perpendicular to the optical axis direction. The lateral surface 331d can be parallel to a lateral surface 331c of the first upper metal part 331A. The distance between the lateral surface 331c and the lateral surface 331d in the first direction X can be 50 µm or less.

As illustrated in FIG. 12, one end of a wiring 270 is bonded to the upper surface of the light emitting element 320A, and the other end of the wiring 270 is bonded to the upper surface 331b of the second upper metal part 331B. For example, a plurality of wirings 270 are bonded to the second upper metal part 331B. In the illustrated example, three wirings 270 are bonded to the second upper metal part 331B. In addition, one end of a wiring 270 is bonded to the second light emitting element 320B, and the other end of the wiring 270 is bonded to the upper surface of the metal film 361 on which the first reflective member 340A and the second reflective member 340B are disposed. For example, a plurality of wirings 270 are bonded to the upper surface of the metal film 361. In the illustrated example, three wirings 270 are bonded to the upper surface of the metal film 361. Further, a wiring 270 electrically connected to the protective element 250 is bonded to the upper surface of the metal film 361. As described, the wiring 270 electrically connected to the protective element 250 is connected to the metal film 361 instead of the second upper metal part 331B. With this configuration, the protective element 250 is connected in parallel to the two light emitting elements 320 that are electrically connected in series. Therefore, the two light emitting elements 320 can be protected from a forward bias current or a reverse bias current.

As illustrated in FIG. 14, in a bottom view, at least a portion of the third lower metal part 332C overlaps with the first light emitting element 320A and the second light emitting element 320B. In a bottom view, the third lower metal part 332C preferably overlaps with the entire first light emitting element 320A and the entire second light emitting element 320B. With this configuration, heat from the first light emitting element 320A and the second light emitting element 320B can be collectively dissipated from the third lower metal part 332C. Further, in a bottom view, the first lower metal part 332A and the second lower metal part 332B do not overlap with the first light emitting element 320A and the second light emitting element 320B.

As illustrated in FIG. 15, a distance L4 between the second emission end surface 320b and a point P3 on the reflective surface 340b closest to the second emission end surface 320b in the first direction X is less than or equal to the thickness T4 of the second upper metal part 331B in the third direction Z. The distance L4 is, for example, the same as the distance L1 in the first embodiment. In this manner, similar to the light emitting device 200, the upper surface 211a of the base 211A is less likely to be irradiated with the main portion of light emitted from the second light emitting element 320B. In addition, the size of the light emitting device 300 in the first direction X can be reduced.

Similar to the light emitting element 220 according to the first embodiment, one or more emission end surfaces of the plurality of light emitting elements 320 according to the second embodiment may protrude further toward a reflective member 340 than the lateral surface, facing the reflective member 340, of an upper metal part in the first direction X. Alternatively, one or more lateral surfaces, facing the reflective member 340, of the upper metal parts may be closer to the reflective member relative to the emission end surface.

Of light emitting from the first light emitting element 320A, light of the main portion travels laterally and is incident on the reflective surface 340a of the first reflective member 340A. The light incident on the reflective surface 340a is reflected upward of the first reflective member 340A, is transmitted through the light transmitting region of the upper part 214, and exits to the outside of the light emitting device 300. Similarly, of light emitted from the second light emitting element 320B, light of the main portion travels laterally and is incident on the reflective surface 340b of the second reflective member 340B. The light incident on the reflective surface 340b is reflected upward of the second reflective member 340B, is transmitted through the light transmitting region of the upper part 214, and exits to the outside of the light emitting device 300.

Third Embodiment

A light emitting module according to a third embodiment includes a plurality of light emitting devices as in the first embodiment, and a wiring substrate having a plurality of wiring patterns arranged in the second direction Y. The plurality of light emitting devices are arranged in the second direction Y. An example of the structure of a light emitting module 400 according to the third embodiment will be described with reference to FIG. 16 through FIG. 18.

Figure 16:
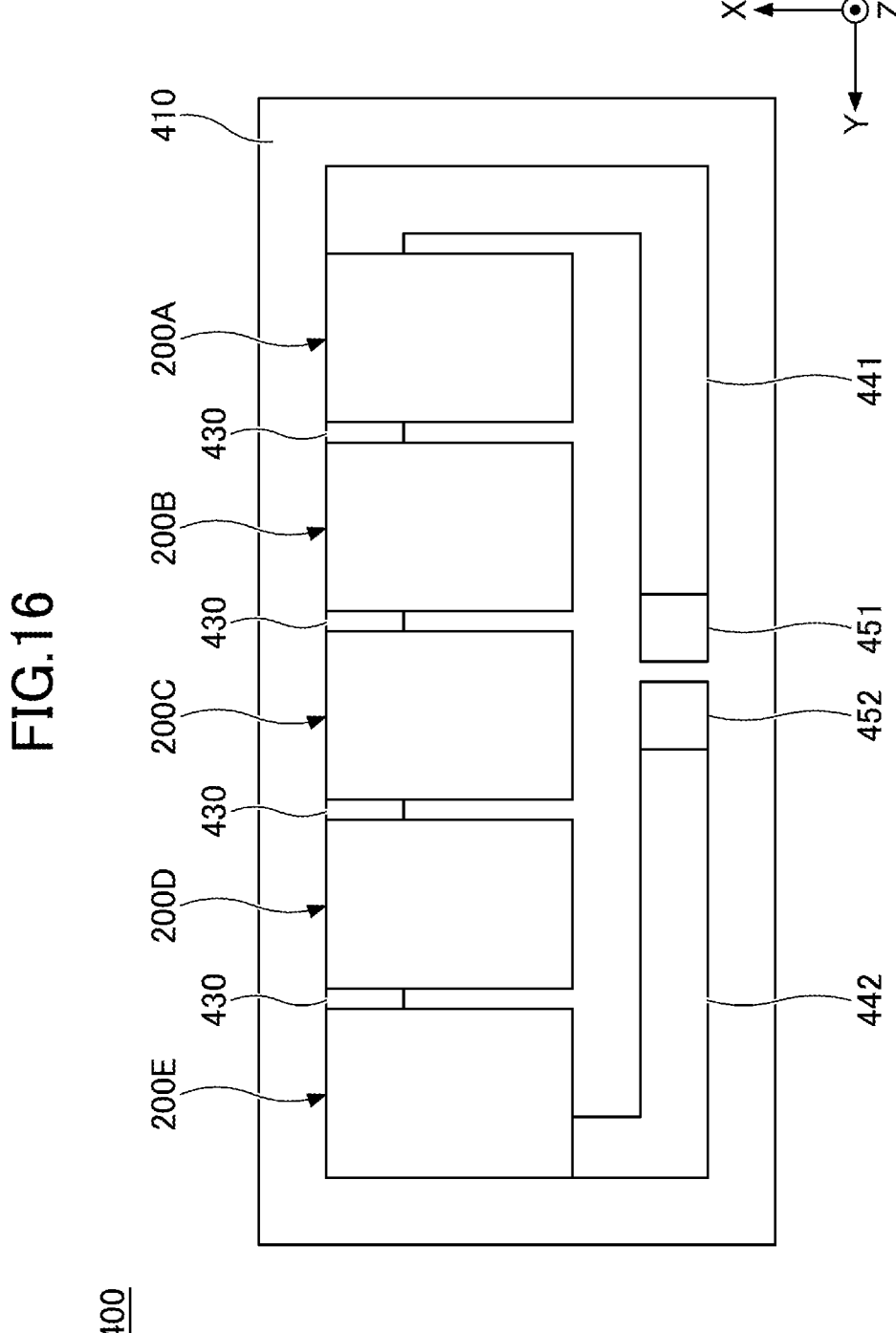
FIG. 16 is a top view of a light emitting module according to a third embodiment.
Figure 17:
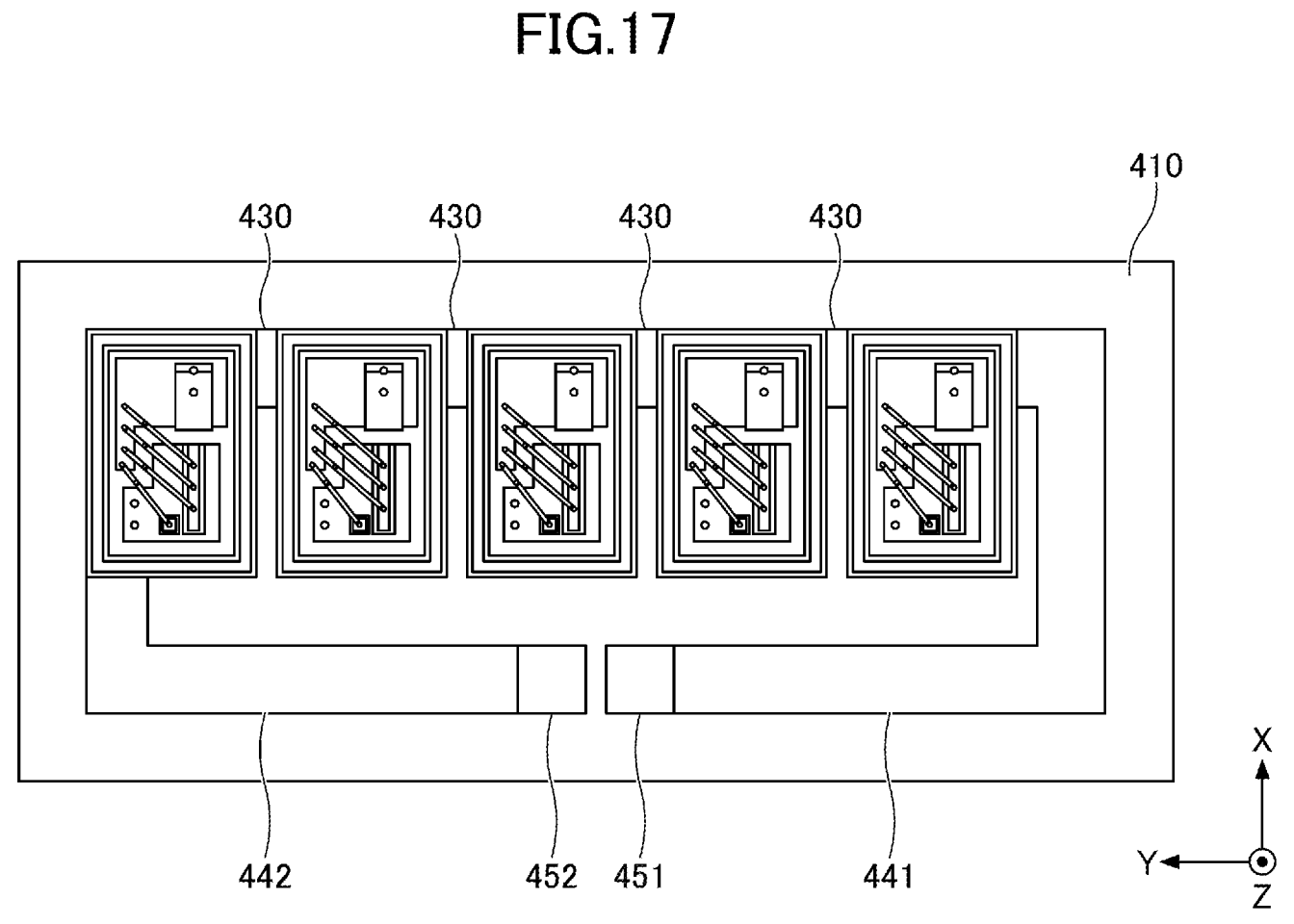

FIG. 16 is a top view of the light emitting module 400 according to the third embodiment. FIG. 17 is a top view of the light emitting module 400 illustrated in FIG. 16, from which covers are removed. FIG. 18 is a top view of a wiring substrate 410 constituting part of the light emitting module 400 illustrated in FIG. 16.

As illustrated in FIG. 16 and FIG. 17, the light emitting module 400 according to the present embodiment includes the wiring substrate 410 and light emitting devices 200A to 200E. The light emitting devices 200A to 200E are denoted by different reference numerals for convenience; however, the light emitting devices 200A to 200E are light emitting devices having substantially the same specifications as the light emitting device 200 according to the first embodiment. The light emitting devices 200A to 200E are arranged on the wiring substrate 410 in the second direction Y. The quantity of light emitting devices disposed on the wiring substrate 410 is not limited to five.

As illustrated in FIG. 18, wiring patterns 420A to 420E arranged in the second direction Y are provided on the upper surface of the wiring substrate 410. Each of the wiring patterns 420A to 420E includes three pads. The three pads are connected to lower metal parts 232 of each of the light emitting devices 200A to 200E. In the wiring patterns 420A to 420E, pads connected to first lower metal parts 232A of lower metal parts 232 are indicated by a dense dot pattern, pads connected to second lower metal parts 232B are indicated by a sparse dot pattern, and pads connected to third lower metal parts 232C are indicated without a dot pattern, in the light emitting devices 200A to 200E. In wiring patterns adjacent to each other in the second direction Y of the wiring patterns 420A to 420E, a pad connected to a first lower metal part 232A and a pad connected to a second lower metal part 232B are electrically connected via a wiring 430.

A pad 421A constituting part of the wiring pattern 420A is a pad that is connected to the first lower metal part 232A of the lower metal part 232 of the light emitting device 200A. The pad 421A is electrically connected to an external electrode 451 via a wiring 441. Further, a pad 421E constituting part of the wiring pattern 420E is a pad that is connected to the second lower metal part 232B of the lower metal part 232 of the light emitting device 200E. The pad 421E is electrically connected to an external electrode 452 via a wiring 442.

In this manner, the light emitting devices 200A to 200E are connected in series between the external electrode 451 and the external electrode 452. Applying voltage between the external electrode 451 and the external electrode 452 can cause the light emitting devices 200A to 200E to emit light simultaneously.

In each of the light emitting devices 200A to 200E, the first lower metal part 232A and the second lower metal part 232B are disposed at positions adjacent to each other at a predetermined interval in the second direction Y. Therefore, small-area patterns on which the light emitting devices 200A to 200E are connected in series can be formed on the wiring substrate 410. As a result, the size of the light emitting module 400 can be reduced. Although an example in which the light emitting devices 200 are disposed on the wiring substrate 410 has been described above, light emitting devices 300 according to the second embodiment can be disposed on the wiring substrate 410 in the same manner.

Modification of Third Embodiment

A light emitting module according to a modification of the third embodiment includes a plurality of light emitting devices in the first embodiment, and a wiring substrate having a plurality of wiring patterns arranged in the second direction Y. The plurality of light emitting devices are arranged in the second direction Y. An example of the structure of a light emitting module 400A according to the modification of the third embodiment will be described with reference to FIG. 19 through FIG. 21.

Figure 19:
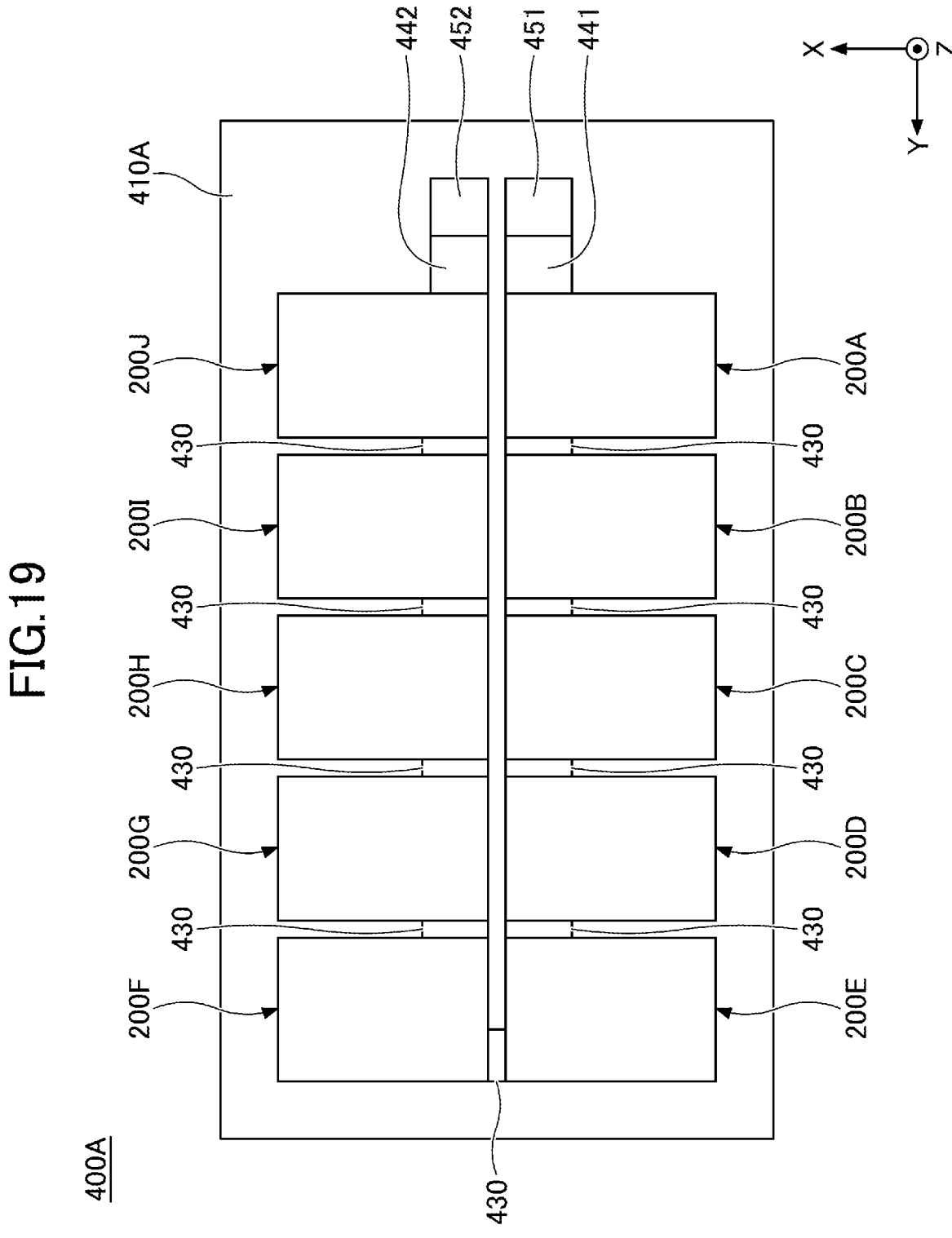
FIG. 19 is a top view of a light emitting module according to a modification of the third embodiment.
Figure 20:
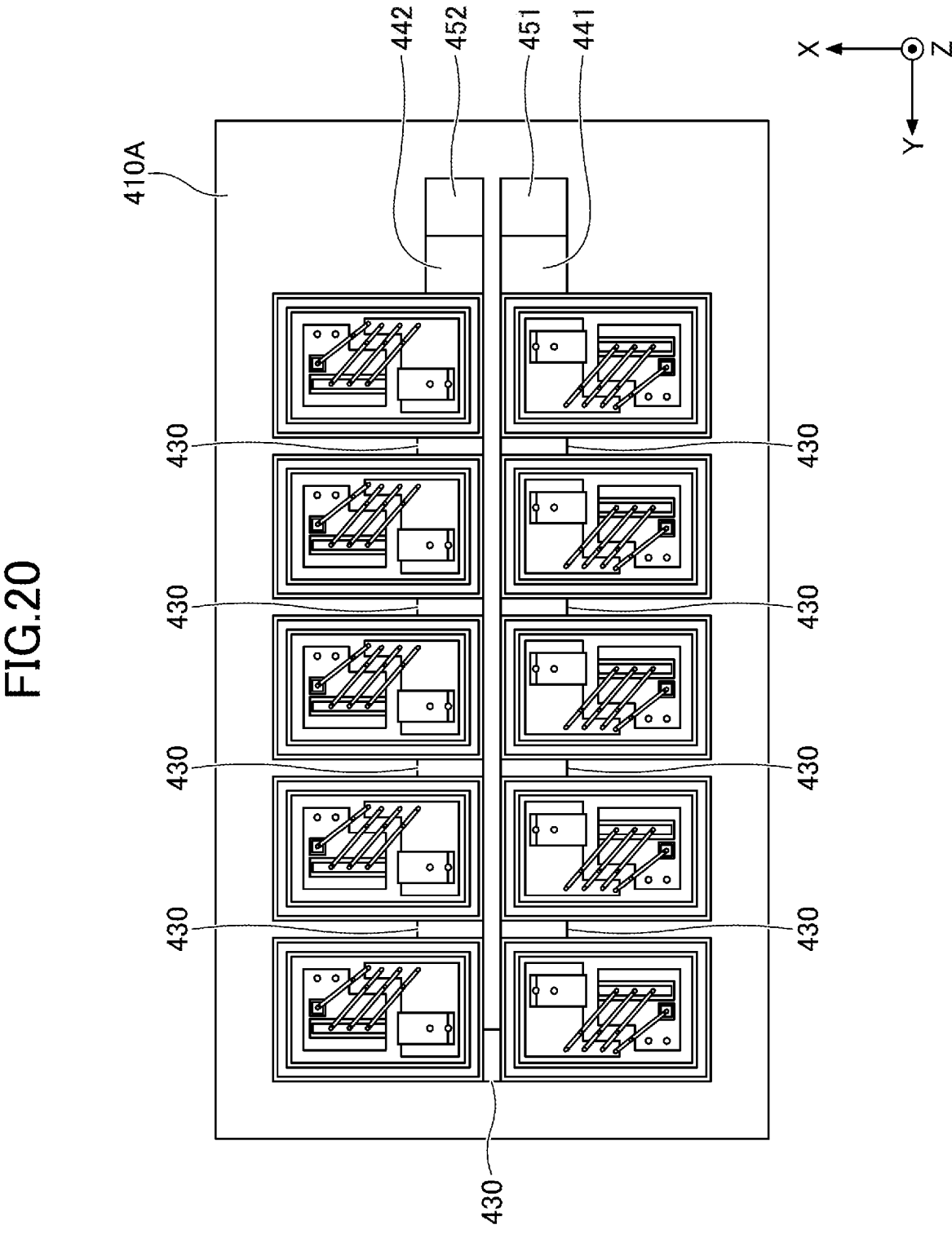
FIG. 20 is a top view of the light emitting module illustrated in FIG. 19, from which covers of the light emitting devices are removed.

FIG. 19 is a top view of the light emitting module 400A according to the modification of the third embodiment. FIG. 20 is a top view of the light emitting module 400A illustrated in FIG. 19, from which covers are removed. FIG. 21 is a top view of a wiring substrate 410A constituting part of the light emitting module 400A illustrated in FIG. 19.

As illustrated in FIG. 19 and FIG. 20, the light emitting module 400A according to the modification includes the wiring substrate 410A and light emitting devices 200A to 200J. The light emitting devices 200A to 200J are denoted by different reference numerals for convenience; however, the light emitting devices 200A to 200J are light emitting devices having substantially the same specifications as the light emitting device 200 according to the first embodiment. The light emitting devices 200A to 200E are arranged on the wiring substrate 410A in the second direction Y, and the light emitting devices 200F to 200J are arranged on the wiring substrate 410A in the second direction Y. The light emitting devices 200A and 200J, the light emitting devices 200B and 200I, the light emitting devices 200C and 200H, the light emitting devices 200D and 200G, and the light emitting devices 200E and 200F are arranged side by side in the first direction X, respectively. The quantity of light emitting devices disposed on the wiring substrate 410A is not limited to 10. Further, three or more light emitting devices may be arranged in the first direction X.

As illustrated in FIG. 21, wiring patterns 420A to 420E arranged in the second direction Y are provided on the upper surface of the wiring substrate 410A. In addition, wiring patterns 420F to 420J arranged in the second direction Y are provided on the upper surface of the wiring substrate 410A. The wiring patterns 420A and 420J, the wiring patterns 420B and 420I, the wiring patterns 420C and 420H, the wiring patterns 420D and 420G, and the wiring patterns 420E and 420F are arranged side by side in the first direction X.

Each of the wiring patterns 420A to 420J includes three pads. The three pads are connected to lower metal parts 232 of each of the light emitting devices 200A to 200J. In the wiring patterns 420A to 420J, pads connected to first lower metal parts 232A of lower metal parts 232 are indicated by a dense dot pattern, pads connected to second lower metal parts 232B are indicated by a sparse dot pattern, and pads connected to third lower metal parts 232C are indicated without a dot pattern, in the light emitting devices 200A to 200J.

In wiring patterns adjacent to each other in the second direction Y of the wiring patterns 420A to 420E, a pad connected to the first lower metal part 232A and a pad connected to the second lower metal part 232B are electrically connected via a wiring 430. Further, in wiring patterns adjacent to each other in the second direction Y of the wiring pattern 420F to 420J, a pad connected to the first lower metal part 232A and a pad connected to the second lower metal part 232B are electrically connected via a wiring 430. Further, a pad of the wiring pattern 420E connected to the second lower metal part 232B and a pad of the wiring pattern 420F connected to the first lower metal part 232A are electrically connected via a wiring 430.

A pad 421A constituting part of the wiring pattern 420A is a pad that is connected to the first lower metal part 232A of the lower metal part 232 of the light emitting device 200A. The pad 421A is electrically connected to an external electrode 451 via a wiring 441. Further, a pad 421J constituting part of the wiring pattern 420J is a pad that is connected to the second lower metal part 232B of the lower metal part 232 of the light emitting device 200J. The pad 421J is electrically connected to an external electrode 452 via a wiring 442.

In this manner, the light emitting devices 200A to 200J are connected in series between the external electrode 451 and the external electrode 452. Applying voltage between the external electrode 451 and the external electrode 452 can cause the light emitting devices 200A to 200J to emit light simultaneously.

In each of the light emitting devices 200A to 200E, the first lower metal part 232A and the second lower metal part 232B are disposed at positions adjacent to each other at a predetermined interval in the second direction Y. Therefore, small-area patterns on which the light emitting devices 200A to 200E are connected in series can be formed on the wiring substrate 410A. Further, in each of the light emitting devices 200F to 200J, the first lower metal part 232A and the second lower metal part 232B are disposed at positions adjacent to each other at a predetermined interval in the second direction Y. Therefore, small-area patterns on which the light emitting devices 200F to 200J are connected in series can be formed on the wiring substrate 410A.

By arranging the light emitting device 200E and the light emitting device 200F side by side in the first direction X such that the second lower metal part 232B and the first lower metal part 232A face each other, the second lower metal part 232B of the light emitting device 200E and the first lower metal part 232A of the light emitting device 200F can be easily connected via the short wiring 430 on the wiring substrate 410. As a result, the light emitting devices 200A to 200J can be easily connected in series, and the size of the light emitting module 400A can be reduced. In the light emitting module 400A as well, light emitting devices 300 can be disposed on the wiring substrate 410A, instead of the light emitting devices 200.

The light emitting devices 200 and 300 and the light emitting modules 400 and 400A can be used for on-vehicle headlights. However, the use of the light emitting devices 200 and 300 and the light emitting modules 400 and 400A is not limited thereto, and the light emitting devices 200 and 300 and the light emitting modules 400 and 400A can be used for light sources for lightings, projectors, head-mounted displays, backlights of other displays, or the like.

According to an embodiment of the present disclosure, the size of a light emitting device can be reduced. Further, the size of a light emitting module can be reduced.

Although embodiments and the like have been described in detail above, the present disclosure is not limited to the above-described embodiments and the like, and various modifications and substitutions can be made to the above-described embodiments and the like without departing from the scope recited in the claims.

What is claimed is:

1. A light emitting device comprising:
   a base comprising a material having an insulating property, the base having an upper surface and a lower surface;
   a first upper metal part located on the upper surface of the base;
   a first light emitting element that is disposed on the upper surface of the base with the first upper metal part being interposed between the first light emitting element and the base, and is configured to emit light laterally from a first emission end surface of the first light emitting element;
   a first reflective member that is disposed on the upper surface of the base without the first upper metal part being interposed between the first reflective member and the base, faces the first light emitting element, and has a first reflective surface configured to reflect the light upward; and
   one or more lower metal parts located on the lower surface of the base; wherein:
   a thickness of the first upper metal part is 150 μm or more and 250 μm or less;
   a distance between the first emission end surface and a first point on the first reflective surface closest to the first emission end surface in a first direction perpendicular to the first emission end surface is less than or equal to the thickness of the first upper metal part in a second direction perpendicular to the upper surface of the base;
   in the second direction, a total thickness of the first upper metal part and a first of the one or more lower metal parts is greater than a thickness of the base;
   the first upper metal part has a lateral surface facing the first reflective member;
   the lateral surface of the first upper metal part protrudes beyond the first emission end surface toward the first reflective member in the first direction; and
   a distance between the lateral surface and the first emission end surface in the first direction is more than 0 μm and 30 μm or less.

2. The light emitting device according to claim 1, wherein:
   a thickness of a first of the lower metal parts is 0.8 times or more and 1.2 times or less the thickness of the first upper metal part.

3. The light emitting device according to claim 1, further comprising:
   a second light emitting element disposed on the upper surface of the base and configured to emit light laterally from a second emission end surface of the second light emitting element;
   a second reflective member having a second reflective surface and configured to reflect the light upward; and
   a second upper metal part that is spaced apart from the first upper metal part, and on which the second light emitting element is disposed; wherein:
   a thickness of the second upper metal part is 150 μm or more and 250 μm or less; and
   a distance between the second emission end surface and a point on the second reflective surface closest to the second emission end surface in the first direction is less than or equal to the thickness of the second upper metal part in the second direction.

4. A light emitting device comprising:
   a base comprising a material having an insulating property, the base having an upper surface and a lower surface;

a first upper metal part located on the upper surface of the base;

a first light emitting element that is disposed on the upper surface of the base with the first upper metal part being interposed between the first light emitting element and the base, and is configured to emit light laterally from a first emission end surface of the first light emitting element;

a first reflective member that is disposed on the upper surface of the base without the first upper metal part being interposed between the first reflective member and the base, faces the first light emitting element, and has a first reflective surface configured to reflect the light upward; and one or more lower metal parts located on the lower surface of the base; wherein:

a thickness of the first upper metal part is 150 μm or more and 250 μm or less;

a distance between the first emission end surface and a first point on the first reflective surface closest to the first emission end surface in a first direction perpendicular to the first emission end surface is less than or equal to the thickness of the first upper metal part in a second direction perpendicular to the upper surface of the base;

in the second direction, a total thickness of the first upper metal part and a first of the one or more lower metal parts is greater than a thickness of the base; and a portion of the first reflective surface is positioned lower than an upper surface of the first upper metal part, and light that is emitted from the first emission end surface and directed downward with respect to an optical axis of the light does not reach a portion of the first reflective surface located above a middle point of the first reflective surface.

5. The light emitting device according to claim 4, wherein:

the first upper metal part has a lateral surface facing the first reflective member;

the first emission end surface protrudes beyond the lateral surface of the first upper metal part toward the first reflective member in the first direction; and a distance between the lateral surface of the first upper metal part and the first emission end surface in the first direction is more than 0 μm and 50 μm or less.

6. The light emitting device according to claim 4, wherein:

the first upper metal part has a lateral surface facing the first reflective member;

the first emission end surface is aligned with the lateral surface of the first upper metal part.

7. The light emitting device according to claim 4, wherein:

a thickness of a first of the lower metal parts is 0.8 times or more and 1.2 times or less the thickness of the first upper metal part.

8. The light emitting device according to claim 4, further comprising:

a second light emitting element disposed on the upper surface of the base and configured to emit light laterally from a second emission end surface of the second light emitting element;

a second reflective member having a second reflective surface and configured to reflect the light upward; and a second upper metal part that is spaced apart from the first upper metal part, and on which the second light emitting element is disposed; wherein:

a thickness of the second upper metal part is 150 μm or more and 250 μm or less; and a distance between the second emission end surface and a point on the second reflective surface closest to the second emission end surface in the first direction is less than or equal to the thickness of the second upper metal part in the second direction.

9. A light emitting device comprising:

a base comprising a material having an insulating property, the base having an upper surface and a lower surface;

a first upper metal part located on the upper surface of the base;

a first light emitting element that is disposed on the upper surface of the base with the first upper metal part being interposed between the first light emitting element and the base, and is configured to emit light laterally from a first emission end surface of the first light emitting element;

a first reflective member that is disposed on the upper surface of the base without the first upper metal part being interposed between the first reflective member and the base, faces the first light emitting element, and has a first reflective surface configured to reflect the light upward;

one or more lower metal parts located on the lower surface of the base;

a metal film located directly under the first reflective member and spaced apart from the first upper metal part in a top view; and a wiring bonded to an upper surface of the metal film and electrically connected to the first light emitting element; wherein:

a thickness of the first upper metal part is 150 μm or more and 250 μm or less;

a distance between the first emission end surface and a first point on the first reflective surface closest to the first emission end surface in a first direction perpendicular to the first emission end surface is less than or equal to the thickness of the first upper metal part in a second direction perpendicular to the upper surface of the base;

in the second direction, a total thickness of the first upper metal part and a first of the one or more lower metal parts is greater than a thickness of the base; and a thickness of the metal film is less than one-third of the thickness of the first upper metal part in the second direction.

10. The light emitting device according to claim 9, wherein:

the first upper metal part has a lateral surface facing the first reflective member;

the first emission end surface protrudes beyond the lateral surface of the first upper metal part toward the first reflective member in the first direction; and a distance between the lateral surface of the first upper metal part and the first emission end surface in the first direction is more than 0 μm and 50 μm or less.

11. The light emitting device according to claim 9, wherein:

the first upper metal part has a lateral surface facing the first reflective member;

the first emission end surface is aligned with the lateral surface of the first upper metal part.

12. The light emitting device according to claim 9, wherein:

a thickness of a first of the lower metal parts is 0.8 times or more and 1.2 times or less the thickness of the first upper metal part.

13. The light emitting device according to claim 9, wherein:

the first upper metal part has a lateral surface facing the first reflective member; and at least a portion of the metal film protrudes beyond a plane in which the lateral surface of the first upper metal part facing the first reflective member extends.

14. The light emitting device according to claim 9, further comprising:

a second light emitting element disposed on the upper surface of the base and configured to emit light laterally from a second emission end surface of the second light emitting element;

a second reflective member having a second reflective surface and configured to reflect the light upward; and a second upper metal part that is spaced apart from the first upper metal part, and on which the second light emitting element is disposed; wherein:

a thickness of the second upper metal part is 150 μm or more and 250 μm or less; and a distance between the second emission end surface and a point on the second reflective surface closest to the second emission end surface in the first direction is less than or equal to the thickness of the second upper metal part in the second direction.

15. The light emitting device according to claim 9, further comprising:

a first via wiring connected to the metal film and located in a first through hole penetrating the base, wherein a first connecting portion between the first via wiring and the metal film overlaps with the first reflective member in the top view; and a second via wiring connected to the first upper metal part and located in a second through hole penetrating the base, wherein a second connecting portion between the second via wiring and the first upper metal part does not overlap with the first light emitting element in the top view.

16. The light emitting device according to claim 15, wherein:

the one or more lower metal parts include a first lower metal part and a second lower metal part, the first lower metal part being connected to the first via wiring, and the second lower metal part being connected to the second via wiring;

the second lower metal part extends in the first direction in a bottom view; and the first lower metal part and the second lower metal part are spaced apart from each other in a third direction that is perpendicular to the first direction and perpendicular to the second direction.

17. A light emitting module comprising:

a plurality of light emitting devices according to claim 16 arranged in the third direction; and a wiring substrate comprising a plurality of wiring patterns arranged in the third direction.

18. The light emitting device according to claim 16, wherein:

the one or more lower metal parts further include a third lower metal part spaced apart from the first lower metal part in the first direction, and spaced apart from the second lower metal part in the third direction; and the second lower metal part is longer than the first lower metal part and the third lower metal part in the first direction.

19. The light emitting device according to claim 18, wherein:

at least a portion of the first lower metal part overlaps with the first reflective member in the bottom view;

the second lower metal part does not overlap with the first reflective member in the bottom view; and at least a portion of the third lower metal part overlaps with the first light emitting element in the bottom view.

\* \* \* \* \*